United States Patent
Brown et al.

(10) Patent No.: US 9,590,306 B2
(45) Date of Patent: *Mar. 7, 2017

(54) ELECTROMAGNETIC ENHANCEMENT AND DECOUPLING

(71) Applicant: OMNI-ID CAYMAN LIMITED, Grand Cayman (KY)

(72) Inventors: James Robert Brown, Farnborough (GB); Christopher Robert Lawrence, Farnborough (GB)

(73) Assignee: OMNI-ID CAYMAN LIMITED, Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 14/943,758

(22) Filed: Nov. 17, 2015

(65) Prior Publication Data

US 2016/0172760 A1 Jun. 16, 2016

Related U.S. Application Data

(63) Continuation of application No. 13/949,176, filed on Jul. 23, 2012, now abandoned, which is a
(Continued)

(30) Foreign Application Priority Data

Jun. 16, 2006 (GB) .................................. 0611983.8
Dec. 13, 2006 (GB) .................................. 0624805.8

(51) Int. Cl.
| | | |
|---|---|---|
| *G08B 13/14* | (2006.01) | |
| *H01Q 9/04* | (2006.01) | |
| *G01V 15/00* | (2006.01) | |
| *G06K 19/077* | (2006.01) | |
| *H01P 7/06* | (2006.01) | |
| *H01Q 1/22* | (2006.01) | |

(Continued)

(52) U.S. Cl.
CPC ............... *H01Q 9/04* (2013.01); *G01V 15/00* (2013.01); *G06K 19/07749* (2013.01); *G06K 19/07771* (2013.01); *H01P 7/065* (2013.01); *H01Q 1/2225* (2013.01); *H01Q 1/38* (2013.01); *H01Q 1/52* (2013.01); *H01Q 13/08* (2013.01); *H05K 9/00* (2013.01)

(58) Field of Classification Search
CPC .......... H01Q 9/04; H01Q 9/0485; H01Q 1/38; H01Q 1/2225; H05K 9/00; G01V 15/00; G06K 19/07749; G08B 13/14
USPC ....... 340/572.1, 572.4, 572.7, 572.8, 825.49, 340/825.69, 10.1, 10.3; 343/745, 751, 343/842, 851; 235/487, 492
See application file for complete search history.

(56) References Cited

U.S. PATENT DOCUMENTS

2006/0255945 A1* 11/2006 Egbert ............. G06K 19/07771
340/572.7
2010/0045025 A1* 2/2010 Cote ................ G06K 19/07749
283/81
2011/0037541 A1* 2/2011 Johnson ............. G06K 19/0726
333/219.1

* cited by examiner

Primary Examiner — Hung T Nguyen
(74) Attorney, Agent, or Firm — McDonnell Boehnen Hulbert & Berghoff LLP

(57) ABSTRACT

Apparatus and methods for providing a substantially surface independent tagging system are disclosed. A resonant dielectric cavity is defined between upper and lower conducting layers, and closed at one end by a conducting base portion. Incident radiation couples into the cavity and is resonantly enhanced. An electronic device or tag paced at the edge of the cavity experiences a high electric field strength on account of this enhancement and is driven into operation.

19 Claims, 15 Drawing Sheets

Related U.S. Application Data continuation of application No. 13/585,579, filed on Aug. 14, 2012, now Pat. No. 8,502,678, which is a continuation of application No. 12/974,333, filed on Dec. 21, 2010, now Pat. No. 8,264,358, which is a continuation of application No. 11/763,570, filed on Jun. 15, 2007, now Pat. No. 7,880,619.

(51) Int. Cl.
  *H01Q 1/52*   (2006.01)
  *H05K 9/00*   (2006.01)
  *H01Q 1/38*   (2006.01)
  *H01Q 13/08*  (2006.01)

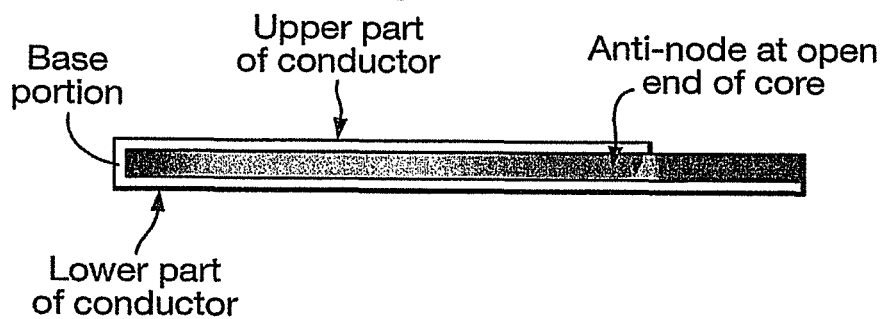
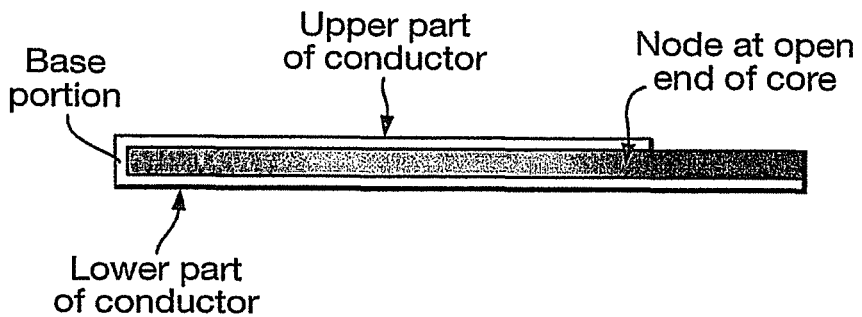
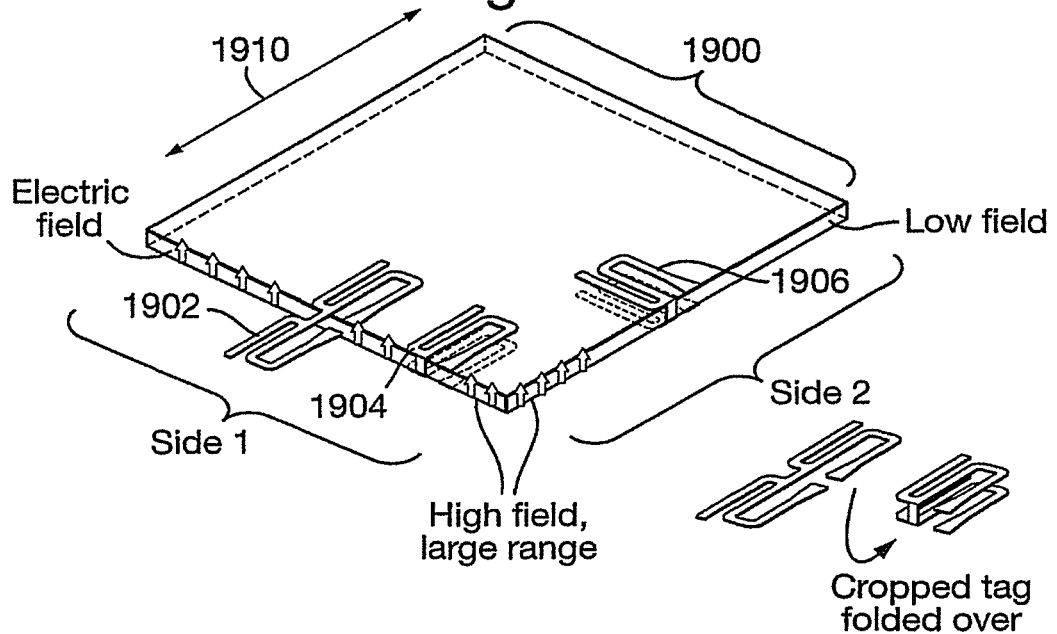

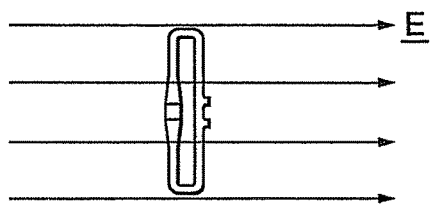 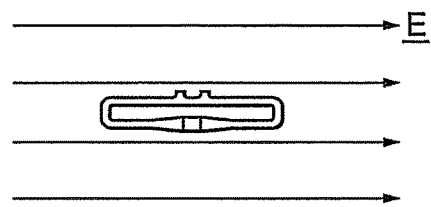
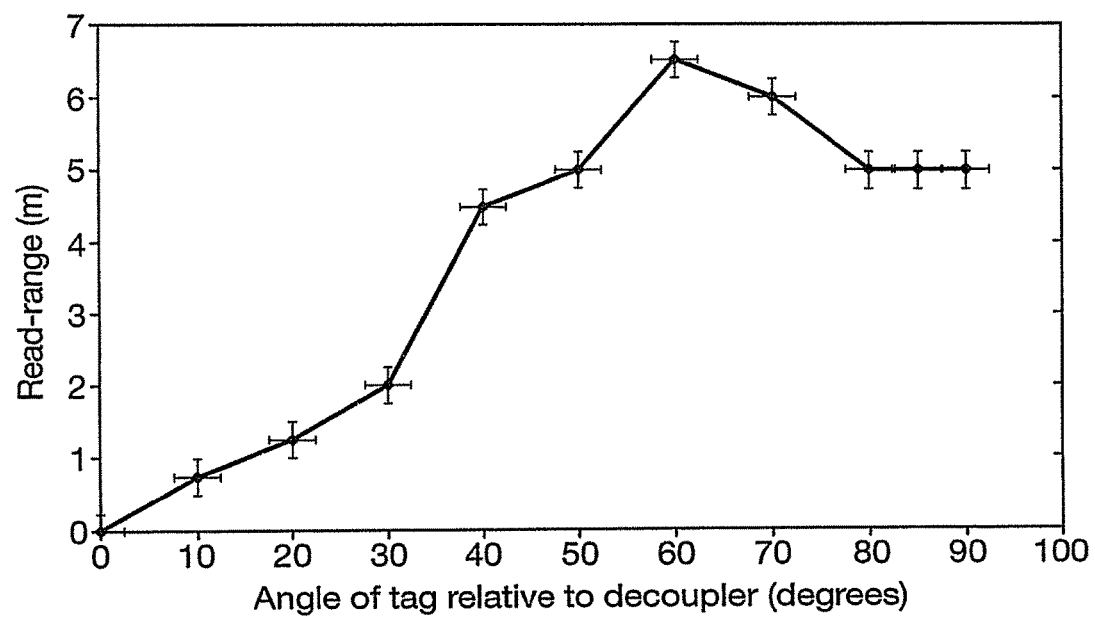

ELECTROMAGNETIC ENHANCEMENT AND DECOUPLING

This application is a continuation of U.S. application Ser. No. 13/949,176 filed Jul. 23, 2013 and now abandoned which is a continuation of Ser. No. 13/585,579 filed Aug. 14, 2012 and now U.S. Pat. No. 8,502,678, which is a continuation of U.S. application Ser. No. 12/974,333, filed on Dec. 21, 2010, and now U.S. Pat. No. 8,264,358, which is a continuation of U.S. application Ser. No. 11/763,570, filed on Jun. 15, 2007 and now U.S. Pat. No. 7,880,619, which claims priority to United Kingdom patent application serial no. 0611983.3, filed on Jun. 16, 2006 and United Kingdom patent application serial no. 0624805.8 filed Dec. 13, 2006, the specifications of each of which are incorporated herein by reference.

BACKGROUND OF THE INVENTION (1) Field of the Invention

This invention relates devices which manipulate electromagnetic radiation (EM) and more specifically relates to the field of coupling energy into identification devices such as RF (radio frequency) tags. The invention allows the tag to be decoupled (i.e. isolated) from surfaces which degrade tag performance, such as metallic surfaces. The invention relates to any EM tag, particularly those that rely upon propagating wave interactions (as opposed to the inductive coupling exhibited by magnetic tags). Hence our preferred embodiment involves application to long-range system tags (e.g. UHF-range and microwave-range tags).

(2) Description of the Related Art

Electronic devices which can transmit a modulated electromagnetic signal that can be detected by an appropriate reader are widely used for the identification and tracking of items, particularly for articles in a shop or warehouse environment. Such devices, which will be referred to throughout this specification as EM tags or simply as tags, generally comprise a chip coupled to an integral antenna which is tuned to a particular frequency of operation. The frequency of operation of current EM tags is generally radio frequencies (RF), including the ultra high frequency (UHF) and microwave ranges but the present invention is applicable to a tag which operates at any frequency. The tags may be passive, in that they interact with incident radiation of the appropriate frequency and re-transmit a modulated signal back to a reader, or active in which the tag contains its own power source.

One commonly experienced disadvantage with such tags, especially passive tags, is that if directly placed on (or within a several millimeters of) a metal surface their read range is decreased to unacceptable levels and—more typically—the tag cannot be read or interrogated. This is because a propagating-wave RF tag uses an integral antenna to receive the incident radiation: the antenna's dimensions and geometry dictate the frequency at which it resonates, and hence tailor the frequency of operation of the tag (typically 866 MHz or 915 MHz for a UHF (ultra-high frequency) range tag and 2.4-2.5 GHz or 5.8 GHz for a microwave-range tag). When the tag is placed near or in direct contact with a metallic surface, the tag's conductive antenna interacts with that surface, and hence its resonant properties are degraded or—more typically—negated. Therefore, the tracking of metal articles such as cages or containers is very difficult to achieve with UHF RF tags and so other more expensive location systems have to be employed, such as GPS.

UHF RFID tags also experience similar problems when applied to certain other surfaces which interact with RF (radio frequency) electromagnetic waves, such as, certain types of glass and surfaces which possess significant water content, examples including certain types of wood with a high water or sap content. Problems will also be encountered when tagging materials which contain/house water such as, for example, water bottles, drinks cans or human bodies etc.

One way around this problem is to place a foam spacer between the RF tag and the surface, preventing interaction of the antenna and the surface. With currently-available systems the foam spacer typically needs to be at least 10-15 mm thick in order to physically distance the RF tag from the surface by a sufficient amount. Clearly, a spacer of this thickness is impractical for many applications and is prone to being accidentally knocked and damaged.

Other methods have involved the provision of unique patterned antennas which have been designed to impedance match a particular RF tag with a particular environment. For example, International patent application WO2004/093249 to Avery Dennison attempts to deal with this problem by using tags having antennas with compensating elements. The antenna is designed with surface effects in mind and is tuned to a particular environment or range of possible environments. This avoids the need for a large spacer but does require relatively complicated antenna designs which must be different for each tag, therefore adding to the cost and complexity of manufacture.

U.S. Pat. No. 5,995,048 describes an antenna design which minimises surface effects in which a quarter wave patch antenna is spaced apart from a much larger ground plane. The design does minimise surface reflection effects but the patch antenna is preferably spaced away from the ground plane by a distance equal to a quarter wavelength which is a large spacing and suffers from the same problems as for the foam spacer mentioned above. It also requires a large ground plane which may be not achievable in all circumstances. Further the patch antenna, which is a resonant circuit, must be carefully impedance matched to the tag resonating circuit in order to operate effectively.

SUMMARY OF THE INVENTION

It is therefore an object of the invention to provide a mount for an EM tag which acts as an electromagnetic radiation decoupler material which mitigates at least some of the problems associated with prior art systems, namely those of thickness, size and flexibility.

It is a further object of the invention to provide apparatus for coupling incident energy into an electronic device or tag, while at the same time isolating such coupling effect from the potentially adverse effects of a substrate on which the device or tag is mounted.

Thus according to the present invention there is provided an electromagnetic radiation decoupler comprising a cavity structure which comprises a conducting base portion connected to a first conducting side wall and a second conducting side wall, the first conducting side wall and second conducting side wall being spaced apart and substantially parallel. Preferably a dielectric material is disposed within the cavity structure.

Embodiments of the invention can therefore be very simple structures comprising a cavity structure formed by two, separate, parallel conducting surfaces each connected to a conducting base portion. The cavity itself is defined by the area of overlap of the two conducting side walls and the conducting end portion. Where the dielectric material is a fluid such as a gas, for example, air, the solid structure of the cavity may be defined only by the conducting side walls and conducting base portion although there may be some solid spacers used to maintain the spacing of the side walls. Where the dielectric material is a solid the sides of the dielectric material may define non-conducting side walls of the cavity structure.

Embodiments according to this aspect of the invention can be thought of as providing an unusually thin sub-wavelength resonant cavity which is closed at one end. Incident radiation at the wavelength of interest couples into the dielectric material and, at a resonant frequency, forms standing waves. Where the cavity length, as defined by the area of overlap of the first conducting side wall with the second conducting side wall, is a quarter of the wavelength of the incident radiation (in the particular dielectric material used) a standing wave situation is created. The conducting base portion and two wall portions together create a continuous metal boundary around three sides of the dielectric core and force the electric field parallel to the surface of the base portion to be a minimum (or a node) at the base portion and therefore (since it is a quarter-wavelength long) at the opposite end of the cavity structure to the conducting base portion the electric field is at a maximum (antinode).

This structure results in the strength of the electromagnetic fields in the core being resonantly enhanced: constructive interference between waves internally reflected by the base portion and those from the interrogating antenna coupled in through the open end of the cavity are superimposed resulting in field strengths of 50 or 100 times greater than that of the incident, radiation. Advantageously, enhancement factors of 200 or even 300 or more can be produced. In more specific applications typically involving very small devices, lower enhancement factors of 20, 30 or 40 times may still result in a readable system which would not be possible without such enhancement. The field pattern is such that the electric field is strongest (has an anti-node) at the open end of the cavity. Due to the cavity having a small thickness the field strength falls off very quickly with increasing distance away from the open end outside the cavity. This results in a region of near-zero electric field a short distance—typically 5 mm—beyond the open end in juxtaposition to the highly enhanced field region. An electronic device or EM tag placed in this area therefore will be exposed to a high field gradient and high electrical potential gradient, irrespective of the surface on which the tag and decoupler are mounted.

An EM tag placed in the region of high potential gradient will undergo differential capacitive coupling: the part of the tag exposed to a high potential from the cavity will itself be charged to a high potential as is the nature of capacitive coupling. The part of the tag exposed to a low potential will similarly be charged to a low potential. If the sections of the EM tag to either side of the chip are in regions of different electrical potential this creates a potential difference across the chip which in embodiments of the present invention is sufficient to drive it into operation. The magnitude of the potential difference will depend on the dimensions and materials of the decoupler and on the position and orientation of the EM tag.

Typical EPC Gen 2 RFID chips have a threshold voltage of 0.5V, below which they cannot be read. If the entirety of the voltage across the open end of the cavity were to appear across the chip then based on a 1 mm thick core and simple integration of the electric field across the open end, the electric field would need to have a magnitude of approximately 250V/m. If a typical incident wave amplitude at the device is 2.5V/m—consistent with a standard RFID reader system operating at a distance of approximately 5 m—then an enhancement factor of approximately 100 would be required. Embodiments in which the field enhancement is greater will afford greater read-range before the enhancement of the incident amplitude becomes insufficient to power the chip.

The present invention therefore provides a device that can be used on any surface and will decouple an EM tag placed thereon from any surface effects. When used in accordance with aspects of the invention an RFID tag can be read at the same range as it could in air or in some cases at a greater range. This obviates the need for antenna redesign or a high index spacer material whilst maintaining a very small overall thickness.

The device can be designed to decouple electromagnetic radiation at a frequency of operation v. Where the device or decoupler is designed to be used for an EM tag the frequency of operation will be the frequency at which the tag is designed to operate and/or the frequency of operation of the reader device. The first conducting side wall preferably has a continuous length of approximately $\lambda_d/4$ measured from the conducting base portion, where $\lambda_d$ is the wavelength, in the dielectric material, of EM radiation at the frequency of operation v. In other words the first conducting side wall extends from the conducting base portion for a distance of approximately $\lambda_d/4$. Preferably the length of the first conducting side wall may be within the range of $\lambda_d/4$ to 15% longer than $\lambda_d/4$, or $\lambda_d/4$ to 10% longer than $\lambda_d/4$, or $\lambda_d/4$ to 5% longer than $\lambda_d/4$ and/or $\lambda_d/4$ to 15% shorter than $\lambda_d/4$, or $\lambda_d/4$ to 10% shorter than $\lambda_d/4$, or $\lambda_d/4$ to 5% shorter than $\lambda_d/4$.

It will be understood that references to lengths of conducting or tuned layers in this specification may refer to the 'effective length' as modified by the refractive index of the dielectric, and that the appropriate meaning will be clear to the skilled reader.

It should be noted that whilst the device will be most effective at the frequency of operation for which it is designed it will actually have an effect at a range of frequencies. There will be a range of frequencies about the intended frequency of operation where the device will still produce a region of high field at the end of the cavity opposite the conducting base portion. Further the skilled person will of course realise that other standing wave patterns, corresponding to different harmonics could be produced. For instance if the length of the cavity corresponded to ¾ of the wavelength of incident radiation a standing wave could be generated which has a maximum at the open end of the cavity. Thus the length of the cavity could be any odd multiple of a quarter of the wavelength of intended operation. However the resonant frequency, i.e. corresponding to a cavity length equal to one quarter wavelength, is preferred.

The second conducting side wall has a continuous length measured from the conducting base portion which is at least as long as the length of the first conducting side wall. Therefore the second conducting side wall may be the same size or larger than the first conducting side wall. When a solid dielectric material is used the dielectric material may be disposed as a continuous layer adjacent the conducting base portion which extends for substantially as long as the first conducting side wall, i.e. the end of the first conducting side wall is also the end of the dielectric material. Alternatively the dielectric material may extend beyond the end of the first conducting side wall.

Embodiments of the present invention can therefore be as small as $\lambda/4$ in length and can be smaller again in width. Thus the area or footprint of such a device can be very small which is advantageous for application to smaller products or where there is limited space on a product to mount the device. Furthermore a small device requires less material which, in mass manufacturing terms, can represent significantly reduced costs.

The thickness of the conducting side walls and dielectric material may be small. The thickness may be much less than the operating wavelength. For instance the total thickness of certain embodiments may be less than $\lambda/10$, or $\lambda/300$ or $\lambda/1000$. The thickness may be 1 mm or less, 2 mm or less, or 500 µm or less, or 100 µm or less.

Embodiments of the present invention can therefore be therefore thinner and lighter compared to foam spacers or known tuned antenna arrangements. Further, selection of appropriate materials and thicknesses can allow such a device to be flexible, enabling it to be applied to non-planar or curved surfaces.

Thus the present invention provides a very small profile device and avoids the needs for large spacer layers.

EM tags may be designed to operate at any frequencies, for example in the range of from 100 MHz up to 600 GHz. Current commercially available RF tags are available which have a chip and antenna and operate at 866 MHz, 915 MHz or 954 MHz. Microwave-range tags are also know that operate at 2.4-2.5 GHz or 5.8 GHz. A tag operating at 866 MHz has a free space wavelength of approximately 0.35 meters (35 cm). The length of a device according to the invention could therefore be approximately 8 cm with an air core. For a tag operating at 2.5 GHz with a free space wavelength of about 12 cm the length of a device having an air core would be slightly less than 3 cm.

As mentioned above the second conducting side wall may be the same size as the first conducting side wall. If a solid dielectric material is present it may be present as a layer of the same size and thus provide a very small footprint decoupler. In use an EM tag would be located in the vicinity of the open end of the cavity structure, i.e. the end opposite the conducting base portion. It could be located within, or across the end of the cavity structure opposite the conducting base portion (which may mean it is at least partly embedded in a solid dielectric material) or may be located across or near the edge of the first conducting side wall. Note that the term open end will be used throughout this specification in relation to a conducting cavity to mean the end of the cavity structure which is opposite to the conducting base portion. It is defined by the end of first conducting layer. The term open end does not imply an absence of material or a void, indeed dielectric material may well extend from within the cavity past the open end, but rather that there is no conducting base portion at the open end.

Conveniently there are no electrical connections other than the conducting base portion between the first conducting side wall and a second conducting side wall. It will be readily appreciated by the skilled man that conducting vias may be incorporated between said side walls. However, further conducting portions which create a substantially enclosed side will create further standing waves to be set up within the cavity structure and may influence the reinforcing effect currently desired in the decoupler.

The length of the first conducting layer may be constant across its width, i.e. the longitudinal distance from the conducting base portion to the end of the first conductor layer is the same at all transverse points, or it may vary. Varying the distance between the conducting base portion and the opposite edge of the first conducting side wall can allow the decoupler to work simultaneously across a range of wavelengths.

The first and second conducting side walls and conducting base portion could comprise a continuous layer of material or could be formed from separate layers of the same or different materials. The conducting material may be any material that has a metallic or otherwise electrically conductive response at the electromagnetic wavelengths of interest. Examples of suitable materials are metals metal alloys, metal composites or carbon. The thickness of the conductive material must be such that it is at least partially non-transmissive with respect to the utilised frequencies of electromagnetic radiation (this is determined by both impedance mis-match and skin depth calculations which will be known to the skilled person). The thickness of the first and second conducting side walls and conducting base portion will hence generally be greater than 0.10 microns for a standard metal, and preferably the thickness is in the range of from 0.25 to 5 microns, more preferably in the range of from 1 to 2 microns. The thickness may be increased beyond 5 microns if desired, particularly if this is required in order to ensure that the chosen conductive material provides at least a partial barrier to the target wavelengths. However, any significant increase in thickness may affect flexibility and increase production costs. Where the decoupler is used such that the second conducting side wall is to be between the EM tag and the surface from which it is wished to decouple the EM tag then there is no maximum thickness requirement for the second conducting side wall. Conveniently, however the second conducting side wall thickness may be selected from the same range as the first conducting side wall. This may be desirable to retain flexibility.

One or more different dielectric materials may be disposed between the two conducting side walls to form a dielectric core. The dielectric material may be any suitable or commonly used dielectric material, but preferably the dielectric core will not be lossy, i.e. the imaginary components of the complex permittivity and permeability may be optimally zero. The dielectric may be a gas, such as air or an inert gas, which may be partially evacuated or pressurised. Obviously if a gas other than air is used, and/or the gas is not at air pressure the decoupler must comprise containment means to maintain the correct dielectric material/pressure within the core. Conveniently, when the dielectric material is not a solid material the separation between the first and second conducting side walls may in part be reinforced by using non-electrically conducting materials between the conducting side walls, such as, for example, corrugated cardboard, honeycomb structures or foams which possess a high void content. The dielectric core material may be formed by an integral part of packaging material or part of a container.

Where the dielectric is an integral part of packaging or a container, such a corrugated cardboard forming part of a cardboard carton, it is desirable to be able to integrate the decoupler into its structure during the manufacture process, reducing costs, avoiding an extra manufacturing step. It is important for the electrical connection to be robust and continuous around the cavity, and therefore processing techniques such as metallic printing may be unsuitable. In a manufacturing process then, it is proposed that a metallic layer be deposited at the edge of the dielectric layer (eg cardboard) and extending over the edge. The metallic layer is then folded around the edge of the dielectric during manufacturing to for the required metal/dielectric/metal structure with a closed end.

Dielectric core materials may also (but not exclusively) be selected from polymers such as, for example, PET, polystyrene, BOPP, polycarbonate and any similar low-loss RF laminates. Commonly-used container materials which may form part or substantially all of the dielectric material may be cellulose materials such as paper, card, corrugated cardboard, or wood. Additionally certain ceramics, ferrites or glasses may be used.

In one embodiment the material chosen to be used in the dielectric core has a refractive index that can be controllably varied in order to control the wavelengths of radiation that are to be decoupled. For example, a polymer dispersed liquid crystalline (PDLC) material can be used as the core. If the decoupler structure is arranged such that a voltage can be applied across the core material then its refractive index can be altered and the decoupled wavelengths will shift in a tailored manner. This may be particularly advantageous as one decoupler may then be used for a range of EM tag wavelengths, or controlled such that the decoupling action may be switched on and off.

Further, if the object to which the decoupler is to be attached requires different EM tags for different locations (e.g. different countries) then a dielectric core layer material with a tunable refractive index would allow the same decoupler to be used for EM tags which operate at different wavelengths.

Embodiments of the invention may comprise more than one cavity structure. Two or more cavities may be arranged, each possibly arranged to maximally decouple at a different frequency. This could allow multiple tags operating at different frequencies to be used.

A decoupler could comprise two cavity structures which share a common conducting end portion, i.e. the decouplers are arranged in a back to back type arrangement. In such an arrangement the decoupler further comprises a second cavity structure which comprises a conducting base portion connected to a third conducting side wall and a fourth conducting side wall, the third conducting side wall and fourth conducting side wall being spaced apart and substantially parallel and having a second dielectric material disposed within the second cavity structure wherein the conducting base portion of the first cavity structure is also the conducting base portion of the second cavity structure.

The side walls of the two cavity structures may generally extend in opposite directions. The first conducting side wall may be continuous with the third conducting side wall, and/or the second conducting side wall may be continuous with the fourth conducting side wall, i.e. there may be two continuous layers of material which form the side walls for both cavities. The length of the first conducting side wall, as measured from the conducting base portion to its edge, may be the same as, or different to, the length of the third conducting side wall. In other words the length of the two cavities may be the same or the length of the first cavity structure may be different to the length of the second cavity structure. In this manner the two cavities can be arranged to optimally decouple different frequencies—the length of the first cavity may correspond to a quarter wavelength of a first wavelength $\lambda_1$ and the length of the second cavity may correspond to a quarter of a second wavelength $\lambda_2$. In use an EM tag tuned to operate at a frequency corresponding to $\lambda_1$ could be located in the vicinity of the open end of the first cavity structure and a tag tuned to operate a frequency corresponding to $\lambda_2$ could be located at the second cavity structure. The dielectric material disposed within the first cavity structure may be the same or different as the second dielectric material.

In an alternative arrangement two cavity structures may be arranged with their open ends adjacent. There could be two distinct cavity structures which may or may not have some separator between them. If a separator is present it may be a conducting separator located a small distance from the open end of each cavity. The second side walls of each cavity may be conductively connected, through a conducting separator if one is present, as long as there is substantially a gap between the first side walls of each cavity. Indeed, the second side wall of one cavity may form the side wall of the second cavity structure, i.e. there is a continuous layer of material. In this instance the decoupler further comprises a second cavity structure which comprises a conducting base portion connected to a third conducting side wall and a fourth conducting side wall, the third conducting side wall and fourth conducting side wall being spaced apart and substantially parallel wherein the second and fourth conducting side walls comprise a continuous layer of conducting material, the edges of the first and third conducting side walls define an aperture between them and the dielectric material is also disposed within the second cavity structure.

The aperture between the first and third conducting side walls may be a complete gap between the edges of the two walls. However there may be a small area of contact or connection between the first and third conducting side walls. Indeed the first and third conducting side walls could comprise a continuous layer of conducting material having an aperture extending substantially transverse to the two cavity structures to define the edges of the cavities.

In this arrangement is it preferred that the combined length of the two cavities is $\lambda_d/2$ and the aperture between the first and third conducting side walls is located at $\lambda_d/4$ from either conducting base portion.

Two or more decouplers could be stacked on top of each other, or side by side. The second side wall of a first cavity structure may form the second side wall of a second cavity structure disposed to the side of the first cavity structure. Again the two cavity structures could have different lengths.

The above aspect of the invention provides for two conductor layers to form the side walls or conducting base portion of the decoupler. However, in cases where the material is to be directly applied to—or form an integral part of—a metallic or other conducting surface (e.g. a car, container, vessel or roll cage) then the metallic surface may form the second conducting side wall and/or the conducting base portion. If a correctly dimensioned first conducting side wall is located a short distance away from a metallic surface, with a dielectric disposed between them and a conducting base portion, the whole structure will act as hereinbefore described and decouple any EM tag placed thereon from the effects of the metallic surface.

Thus in another aspect of the invention there is provided an electromagnetic radiation decoupler for decoupling an electronic device from a conducting surface comprising a first conducting side wall connected to a conducting end portion and means for spacing the first conducting side wall from the conducting surface such that the conducting end portion makes contact with the conducting surface. The means for spacing the first conducting side wall from the conducting surface may be at least one layer of dielectric material that will, in use, be located between the first conducting side wall and conducting surface. Alternatively if the dielectric material is to be air, then the means for spacing the first conducting side wall from the conducting surface may comprise one or more spacers.

Preferably the length of the first conducting side wall is approximately one quarter of the wavelength of the radiation of intended operation. The length may be within the range of $\lambda_d/4$ to 15% longer than $\lambda_d/4$, or $\lambda_d/4$ to 10% longer than $\lambda_d/4$, or $\lambda_d/4$ to 5% longer than $\lambda_d/4$ and/or $\lambda_d/4$ to 15% shorter than $\lambda_d/4$, or $\lambda_d/4$ to 10% shorter than $\lambda_d/4$, or $\lambda_d/4$ to 5% shorter than $\lambda_d/4$.

All of the advantages and embodiments of the invention previously described are applicable to this aspect of the invention also.

The invention allows EM tags (especially RF tags) to be located on any surface without detrimental effects. Therefore the invention also relates to a substantially surface independent EM tag comprising an EM tag mounted on a decoupler as described above.

As noted above, when discussing the nature of the electric field enhancement produced, the EM tag is mounted in the vicinity of the edge of the first conducting side wall. It may be located, at least partly, on the first conducting side wall and may be located so that the tag antenna is located at the edge of the first conducting side wall opposite the conducting base portion, i.e. at the open end of the conducting cavity. The EM tag should be electrically isolated from the first and second conducting side walls, which is to say that there should not be a direct electrical contact. RF tags are typically printed onto a dielectric substrate and this substrate may be placed directly in contact with the surface of the first conducting side wall. Preferably however there may be a further dielectric material, defined to be a spacer, placed between the EM tag and the decoupler material. When a spacer is present the length and width dimensions of the spacer must be at least the same as that of the metal areas (for example, antennas) of the EM tag. Most EM tags are supplied already mounted on their own substrate, which varies in thickness depending on the manufacturer, and in embodiments the tag substrate may act as the spacer. The EM tag must not be in direct electrical contact with either the first or second conducting side walls.

Preferably the (total) gap between the metal part of the EM tag and the decoupler (i.e. spacer thickness+RF tag substrate thickness) is in the range of from 100 to 1000 microns, or in the range from 175 to 800 microns, or 300 to 800 microns, or 300 to 600 microns. These values may differ if a spacer or tag substrate exhibiting lossiness or an unusually high or low refractive index is used (i.e. if something other than a standard polymer substrate such as a PET is used). Similarly, a shift to higher or lower frequencies of operation may affect spacer thickness.

The skilled person will appreciate that the EM tag can be viewed as a resonating circuit and that the cavity structure can also be viewed as a different resonating circuit. The cavity is acting as a surface independent field enhancer in the vicinity of the open end of the cavity/area of absence—energy couples into the decoupler and forms a standing wave. Provided the tag or device is located in the region of high field enhancement, energy will couple from the cavity to the tag. In this case the two circuits are liked via capacitive coupling rather than by a direct electrical or Ohmic connection. This reduces the need for impedance matching and makes redesigning the decoupler for different tags unnecessary, in contrast to prior art approaches.

As an alternative to locating the tag on the surface of the decoupler the EM tag may be located across or within the open end of the conducting cavity, i.e. between the first and second conducting side walls. The EM tag may therefore be at least partly embedded or located within the dielectric material. Again however it is important to ensure that the tag is not in electrical contact with the first or second conducting side walls.

The metal antennas of EM tags may be easily deformed or scratched by normal handling. Advantageously the EM tag and decoupler may be in part covered or enveloped by a protective housing. The housing may be a non-conducting material deposited on the surface of the EM tag and the decoupler. The non-conducting material may simply be further dielectric material applied—for example—via spin coating techniques, depositing materials such as for example PET, PETG UPVC, ABS or any suitable potting compound, such as, for example, an epoxy etc. It has been found that such housing coatings in the range of from 250-2000 microns and even up to 5000 microns do not appreciably affect the read range of RF tags. Clearly the thickness of the housing will be selected depending on the environment and the flexibility required from the tag.

RF tags generally consist of a chip electrically connected to an integral antenna of a length that is generally comparable with (e.g. $\frac{1}{3}^{rd}$ of) their operational wavelength. The present inventors have surprisingly found that tags having much smaller and untuned antennas (i.e. which would not normally be expected to operate efficiently at UHF wavelengths) can be used in conjunction with a decoupler according to the present invention. Usually tags with such 'stunted' antennas (sometimes referred to as low-Q antennas, as will be appreciated by one skilled in the art) possess only a few centimeters or even millimeters read range in open space. However, it has surprisingly been found that using such a tag with a low-Q antenna mounted on a decoupler of the present invention may be operable and exhibit useful read ranges approaching (or even exceeding) that of an optimised commercially-available EM tag operating in free space without a decoupler. Low-Q antennas may be cheaper to manufacture, and may occupy less surface area (i.e. the antenna length of such a tag may be shorter than is usually possible) than a conventional tuned antenna. Therefore the EM tag may be a low Q-tag, i.e. an EM tag having a small, untuned antenna. In this way, the decoupler of the present invention can be considered to render precisely tuned tag antennas superfluous: the peripheral tuning elements of many designs of tag antenna are simply not needed: the central loop and chip are all that is required. This allows the size of the tag and therefore the size of the decoupler to be reduced to less than that of a typical tag c.10 cm.

In embodiments of the invention incorporating such loops or low Q antennas, the term decoupler is still appropriate since a tag system is provided which is substantially unaffected or isolated from the effects of a substrate, however it is perhaps less instructive to think of the tag being decoupled from a substrate per se. Rather, it may assist understanding to appreciate that it is the capture of incident energy into the cavity and the consequent activation of the tag by local field enhancement, which is decoupled from or substantially unaffected by potentially adverse effects of a substrate on which a device is mounted.

Embodiments of the invention which are dimensioned to operate at the frequency of a particular EM tag can be used in conjunction with that tag on any surface without needing any tuning of the tag. The resulting structure is small and thin and so can be applied to a very large number of surfaces without requiring protruding spacers or the like. It can also be used on small products. Further the materials cost and manufacturing cost is very low. When applied to a metallic surface the surface may even form part of the structure thus reducing further materials cost and profile.

In use the decoupler may be located on any surface and may offer advantages, in terms of operation with an EM tag/RF tag as compared to the use of no decoupler, as will be described. The decoupler is clearly of use on surfaces which, due to electromagnetic interactions within or substantially on the surface of the material, would otherwise have a detrimental effect on the operation of the EM tag's own antenna.

The decoupler will allow RF tags which are correctly located to operate on or in near proximity to surfaces which are either non-reflective or reflective to incident RF radiation since the decoupler effectively acts as a barrier against the further propagation of electromagnetic radiation. The advantages of the invention are apparent on surfaces which are reflective or have an effect on incident radiation which is detrimental to the receipt thereof by an electronic device. Typically such RF reflective surfaces may be conductive materials, materials which comprise high liquid content or surfaces which form part of a containment means for such a fluid. It has been found that certain types of glass interact with RF tags and so the decoupler may also find use on glass, silica or ceramics.

Typical RF reflective conductive materials may be carbon, metal, metal alloys, Indium tin oxide (ITO) or metal composites. Materials with a high liquid content may be cellulose materials, for example, certain woods, card, paper or any other naturally occurring materials which may possess a high moisture content.

The decoupler may also be usefully applied to surfaces which are in environments or areas of high humidity, damp or even to surfaces which are partly or completely submerged beneath the surface of a fluid, such as for example a liquid such as water. Therefore the decoupler and, in use, EM tag may be located either on the outside or inside, with appropriate encapsulation, of a drinks or food container. Further applications of the decoupler in submarine environments include identification of underwater pipelines via RFID technology.

The decoupler may be applied to a surface which forms an integral part of a containment means for a fluid, such as a food, drink or chemical container. It is known that liquids such as water interfere with RF radiation and hence detrimentally influence the performance of RF tags in their vicinity.

As mentioned the present invention is of particular significance in decoupling or isolating RF tags from the effects of the surface upon which they are mounted. Thus another aspect of the invention is the use of a device as described as a mount for an RF tag, especially on a surface which would interfere with incident RF radiation. The invention also relates to the use of a device as described with a low Q RF tag to enable useful read ranges.

According to a further aspect of the invention therefore, there is provided the use of apparatus comprising a resonant dielectric cavity defined between first and second substantially parallel conducting side walls, and closed at one edge by a conducting base portion electrically connected between said first and second side walls, to enhance an incident electric field at an open edge of said cavity.

In certain embodiments the incident electric field is enhanced by a factor greater than or equal to 50, greater than or equal to 100, or greater than or equal to 200. If a typical incident wave amplitude at the device is taken to be 2 or 3V/m, which is consistent with current commercially available reader systems at a typical distance of approximately 5 m, then such enhancement can advantageously be used drive a device such as an identification chip of an RF device into operation, with enhanced values in excess of, for example, 100, 200 or 300V/m or more being easily achievable. It will be understood however that the precise values of incident wave amplitude, enhancement factor, enhanced field strength and drive voltage across the device can be tailored for particular applications. Use of apparatus in this way allows devices such as the low Q tag described herein, having a small untuned antenna or loop, and which would otherwise be substantially unreadable, to be read using commercially available reader technology.

A still further aspect of the invention provides apparatus comprising a resonant dielectric cavity defined between first and second substantially parallel conducting side walls, said resonant cavity being closed at one edge by a conducting base portion electrically connected between said first and second side walls, and an electronic device located adjacent to an open edge of said cavity. The electronic device is preferably responsive to an electric field ie has a desired response to an incident electric field of sufficient magnitude, such as the RFID tags and low Q tags discussed herein.

The resonant cavity is typically adapted to enhance an incident electric field at an open edge of said cavity, and the electronic device is located at least partially in a region of enhanced electric field at said open edge. Where for example the device is a low Q tag comprising a chip and a coupling loop, at least a part of the device, eg, part of the loop if not the chip itself, is preferably located within the region of enhancement.

Although embodiments in which the device is located at an edge adjacent to the conducting base portion could be envisaged, the open edge is preferably substantially opposite the conducting base portion.

The electronic device preferably has no electrical contact, or looked at differently, no ohmic contact, with said first or second side walls.

The invention extends to methods, apparatus and/or use substantially as herein described with reference to the accompanying drawings.

Any feature in one aspect of the invention may be applied to other aspects of the invention, in any appropriate combination. In particular, method aspects may be applied to apparatus aspects, and vice versa.

DESCRIPTION OF THE FIGURES

Preferred features of the present invention will now be described, purely by way of example, with reference to the accompanying drawings, in which:

FIG. 16, FIG. 17, FIG. 18A, FIG. 18B, FIG. 19, FIG. 20, FIG. 21, FIG. 22A, FIG. 22B, FIG. 23, FIG. 24, FIG. 25, FIG. 26, FIG. 27 and FIG. 28 illustrate the performance of various embodiments of the invention.

DESCRIPTION OF THE CURRENT EMBODIMENT

Figure 1:
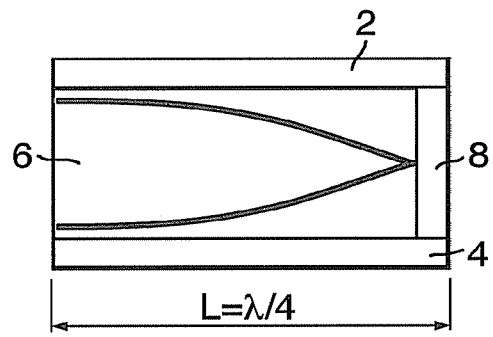
FIG. 1 shows a side view of a device according to the present invention.
Figure 2:
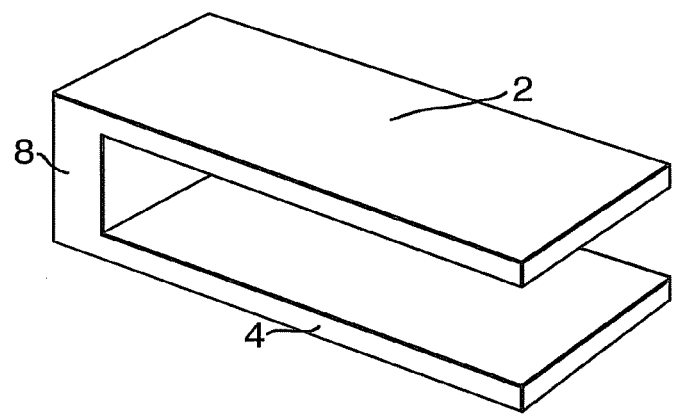
FIG. 2 shows a perspective view of a device according to the present invention.

FIG. 1 shows a side view of a device or decoupler according to the present invention. The decoupler has a layer of metal forming a first conducting side wall 2 spaced apart from and parallel to a another layer of metal forming a second conducting side wall 4. These two side walls enclose a dielectric material 6 which may be air or may be one or more layers of material such as PET. The two conducting side walls define a sub wavelength cavity, one end of which is closed by a conducting end or base portion 8. One or both of the first and second conducting side walls 2, 4 may be continuous with the conducting base portion 8. The end of the cavity opposite the conducting base portion 8 is an open end, i.e. it has no conducting wall. The conducting base portion 8 is the only conducting link between the first and second side walls 2, 4. The decoupler is shown in FIG. 2 in perspective view. For clarity no solid dielectric layer is shown.

The device is designed to decouple radiation at a particular frequency. It is convenient to consider a simplistic model of the functionality of the decoupler, in which RF waves are coupled into the cavity and propagate along inside it until they reach either a closed end e.g. metal wall, or an open end. A proportion of the wave is reflected at the end (whether the end is open or closed) and travels back along inside the cavity.

When the length of the cavity is just right the waves running back and forth set-up standing waves. The standing waves lead to the creation of regions of very high electric field—the electric field is resonantly enhanced. An RF tag which operates at that frequency which is located near to/in the high-field region is forced into operation. The electric field will be a minimum next to the metal wall or base portion (closed end) and a maximum at the open end. Therefore the standing wave pattern formed is a quarter wave pattern, as illustrated in FIG. 1. Therefore where $L=\lambda_d/4$, where $\lambda_d$ is equal to the wavelength of incident radiation within the dielectric material (which is equal to the free space wavelength divided by the refractive index of the dielectric material, $\lambda_0/n$), a quarter wave standing wave pattern will be generated within the dielectric material of the cavity. This leads to a very high field at the frequency of interest within the vicinity of the open end, whatever material the decoupler may be mounted on. Therefore a tag can be placed on or near the open end to couple to the enhanced field in this region.

Figure 3:
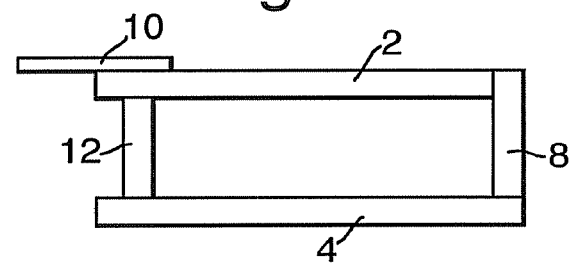
FIG. 3 shows possible positions for mounting an RF tag on a decoupler.

FIG. 3 shows some possible positions where a tag could be located on a decoupler. An RF tag 10 could be located on the first conducting side wall 2 across the end of the side wall. The tag is located on a spacer (not shown) to separate it slightly from the surface of the conducting material. The electric field in this region is high and would couple well to the tag antenna. Alternatively a tag 12 could be located within the cavity, close to the open end. The figure shows the tag 12 only schematically, and it will be appreciated that the precise orientation of the tag within the cavity will depend on the precise geometry of the tag and cavity. Given the low thickness of many embodiments, a planar tag will most likely be located in the cavity, substantially parallel with the upper and lower layers.

Figure 4:
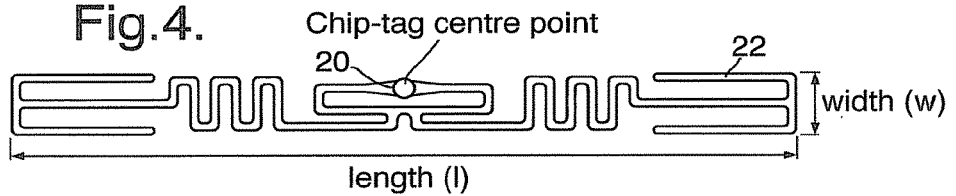
FIG. 4 illustrates a commercially available RF identification tag.

FIG. 4 shows a plan view of a commercially available standard UHF tag (for example an 866 MHz Alien Technologies UHF 'Squiggle' Tag), comprising a chip 20 having an integral antenna 22. The width, w, of the tag is 8 mm and the length, l, of the tag is 95 mm. It can clearly be seen that the majority of the size of the tag is due to the antenna (a typical situation for a commercially available UHF RFID tag). The chip itself is much smaller, in the order of 1-2 mm. The antenna is tuned for free space operation although different antennas could be used which are tuned for a tag used in a particular environment. Operation in a different environment would require a different tuned antenna. The present invention allows such a tag tuned for free space to be mounted on a decoupler and then used satisfactorily in a large number of environments where performance would normally be degraded.

Some RF tags possess directional antennas (i.e. antennas that preferentially interact with linear polarisation of a specific orientation) and therefore may only operate correctly when the tag is correctly orientated with respect to the reader to ensure that radiation incident at the tag and/or emitted by the tag matches the polarisation of radiation emitted or received by the reader. When the tag is mounted on the surface of the decoupler it should therefore be generally arranged in line with the axis of the cavity.

Figure 5:
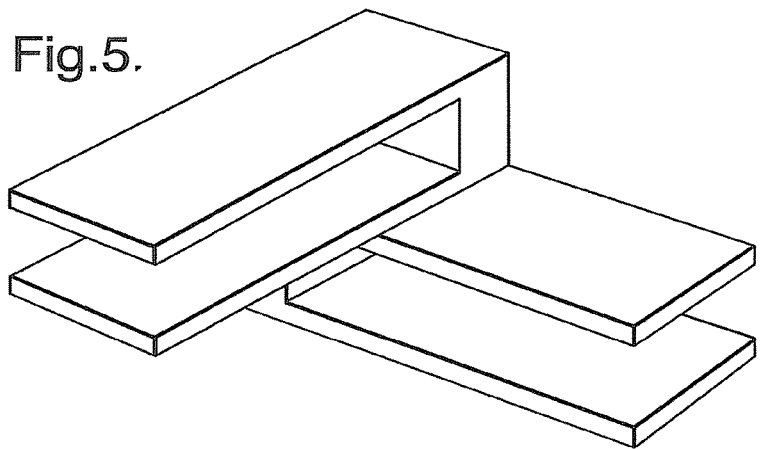
FIG. 5 shows an embodiment of the invention having multiple cavities.
Figure 6:
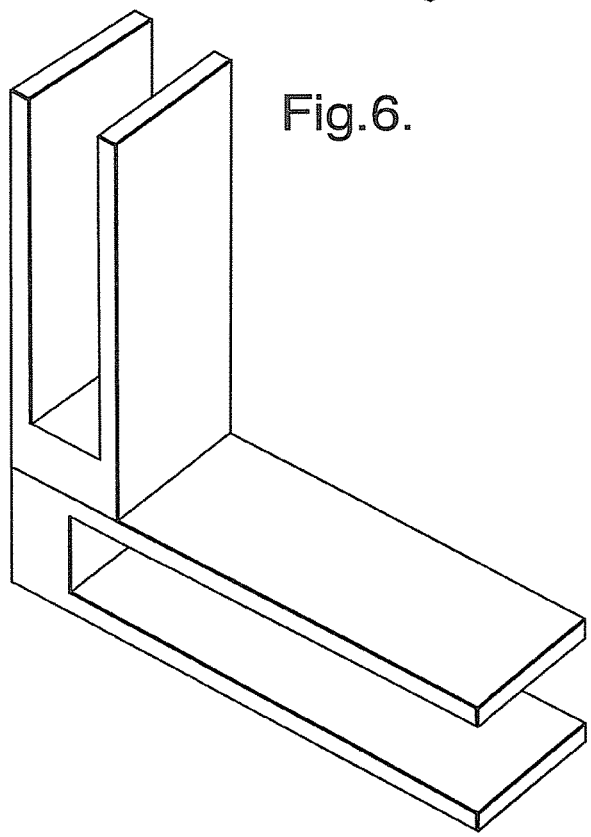
FIG. 6 shows an alternative embodiment of the invention.

The need for correct orientation is not necessarily an issue for certain applications, for instance on standard packaging where the tag and decoupler are located in a known place and orientation on the article. Orientation issues may also be overcome by using transmitter/receiver systems which utilise circular or elliptical polarisations, or multiple and differently-aligned antennas. For instance FIG. 5 shows two quarter wave decouplers of the present invention, one on top of the other and rotated by 90°. Radiation of the appropriate wavelength having a first polarisation would create a standing wave in one of the decouplers. Radiation of the orthogonal polarisation would create a standing wave in the other decoupler. Were each decoupler to carry an appropriately located RF tag then one would be activated whatever the polarisation of the incident radiation. Obviously the two decouplers could be in the same plane instead of located one on top of another and two or more separate decouplers could be used in different orientations. FIG. 6 shows an alternative arrangement where the decouplers are in the same plane, but the side walls are not in the same plane. Such an arrangement could find application at the corners of objects for example.

Figure 7:
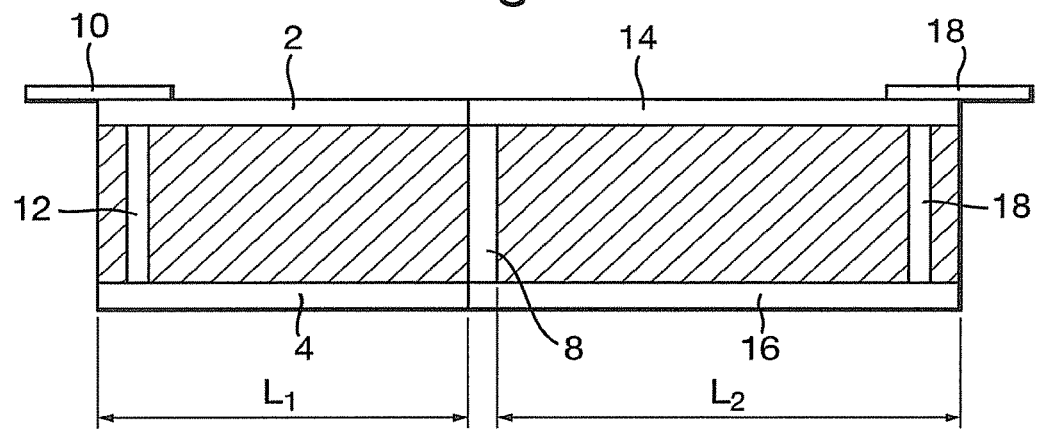
FIG. 7 shows a two back to back cavity structures.

Two decouplers could be located back to back. FIG. 7 shows a side view of a two decouplers in a back to back arrangement. The two decouplers share a common conducting end portion 8. The top side wall of the left hand decoupler 2 can be a continuous layer with the top side wall 14 of the right hand decoupler or they may be separate. Similarly the lower side wall 4 of the left hand decoupler may be a continuous layer forming lower side wall 16 of the right hand decoupler also.

Figure 8:
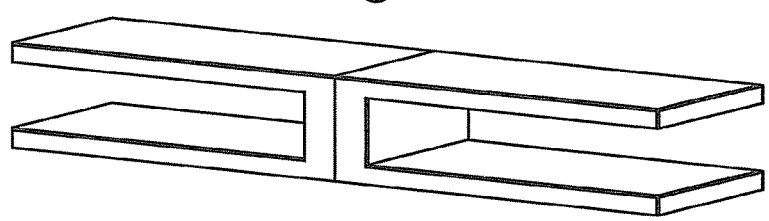
FIG. 8 shows a perspective view of a back to back cavity structure.

The length of the cavity on the left is $L_1$ and the length of the cavity on the right is $L_2$. Whilst these cavities could be the same length it may be advantageous to ensure that they are different lengths, each cavity being arranged to couple radiation at a different wavelength. Thus a tag 10 or 12, which operates at a frequency corresponding to a wavelength of $4L_1$ could be located on the left hand decoupler and a different tag, 18, which operates at a frequency corresponding to a wavelength of $4L_2$ could be located on the right hand decoupler. This would allow two different tags to be mounted on a device and both to work. This could be useful in tagging items travelling around the world where different frequencies are used. Even if only one tag is to be used this design of decoupler allows a user a choice of tag frequency. FIG. 8 shows a similar back to back decoupler design from a perspective view point.

Figure 9:
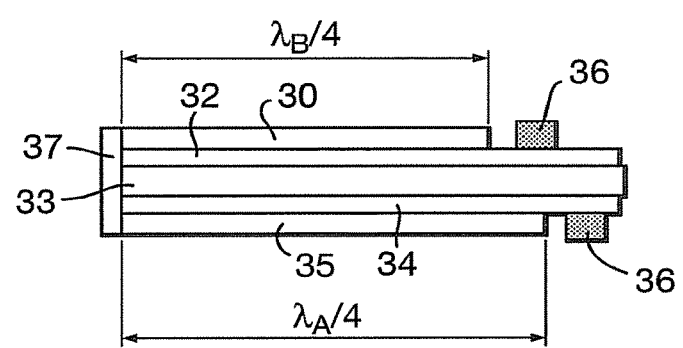
FIG. 9 shows an embodiment of a broad band decoupler.

Another design of decoupler which allows different wavelengths to be decoupled is shown in FIG. 9. Here two decouplers are in effect stacked on top of each other and share a common second conducting side wall. A first cavity of length $\lambda_B/4$ is formed by conducting layer 30, dielectric 32 and second conducting layer 33. The cavity is closed at one end by conducting base portion 37. Note that the dielectric material 32 and second conducting layer 33 both extend beyond the first conducting layer 30. The length of the cavity is determined by the length of area of overlap, i.e. the length of the first conducting layer 30. A second conducting cavity is formed by a third conducting layer 35, dielectric 34 and second conducting layer 33 with one end being closed by conducting base portion 37. Again the dielectric material 34 and second conducting layer 33 extend beyond the third conducting layer 35 and the length of the cavity, defined by the length of the third conductor layer, is $\lambda_A/4$. It will be clear therefore that each cavity will operate most effectively at a different wavelength and therefore appropriate tags 36 could be positioned in areas, which in use at the appropriate frequency, correspond to areas of high field.

Figure 10:
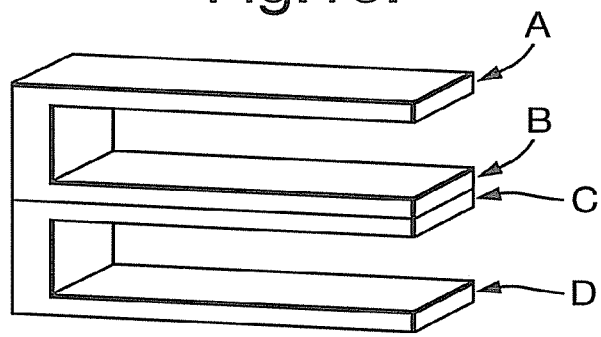
FIG. 10 shows another embodiment of the invention having side by side cavities.

Such an arrangement could be beneficial with decoupler cavities of the same length. In the arrangement shown in FIG. 10 a tag placed with its antenna across the open ends of both cavities may benefit from the enhancing effects of the two cavities. In essence, two oscillating, in-phase dipoles are exhibited across AB and CD. A third is created across the metallic region BC, but this is out of phase with the other two. It is believed that, since BC is a much shorter distance than AB or CD, the field across BC may dominate, creating a higher field intensity than can be obtained via a single cavity. Alternatively, it may be possible to create a geometry in which the AB & CD fields dominate, driving currents through the antenna more efficiently than in the case of a single cavity. Although two cavities have been shown, the concept could be extended to three or more cavities joined in a similar fashion.

Figure 11:
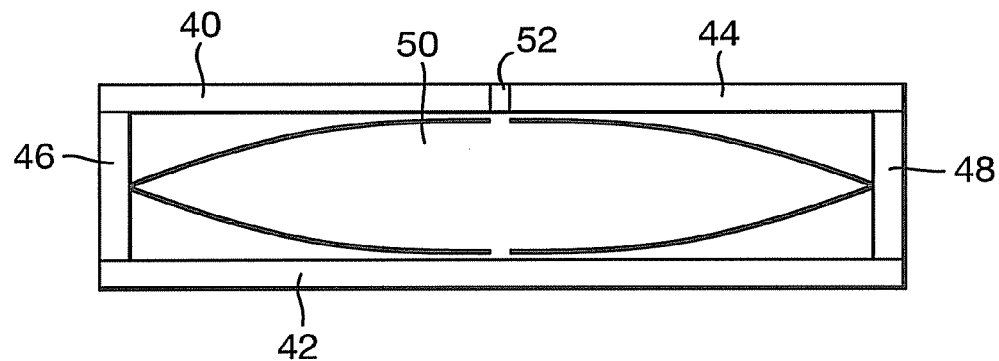
FIG. 11 shows two cavity structures with co-located open ends.

FIG. 11 shows an alternative embodiment in which two cavities have their open ends adjacent. A first cavity is formed by conducting layers 40 and 42. These layers enclose dielectric material 50. The cavity is closed at one end by conducting base portion 46. Conducting layer 42 extends to also form the side wall of a second cavity, which further comprises conducting layer 44. Conducting layers 44 and 42 also enclose dielectric material 50 and there is a conducting base portion 48 closing one end. A small gap, or aperture 52 between conducting layers 40 and 44 is located midway between the two conducting base portions 46 and 48. The aperture provides an effective open end for the two cavities (although one could think of it as a half wavelength cavity which is closed at both ends and has a quarter wavelength slit therein). An RF tag located over the aperture 52 or within the dielectric material in the vicinity of the aperture would be located, in use, in an area of high electric field and would be decoupled from any surface effects.

Figure 12:
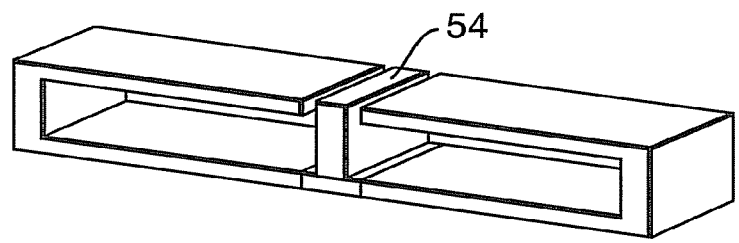
FIG. 12 shows another end to end cavity structure.

FIG. 12 shows a similar embodiment but having a spacer 54 between the two cavities.

Figure 13:
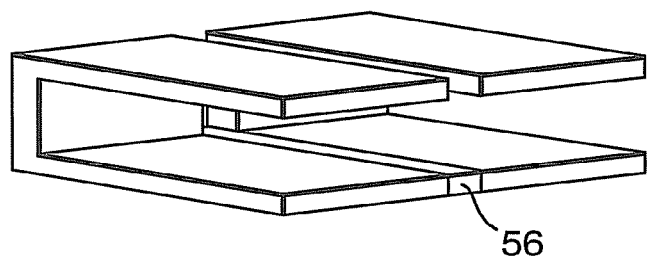
FIG. 13 shows an alternative side by side cavity structure.

FIG. 13 shows a different embodiment of a multiple cavity decoupler where the cavities are side by side and separated by a spacer 56 which may or may not be conducting. This could in effect by formed by a single quarter wave decoupler having an aperture in the top layer.

Figure 14:
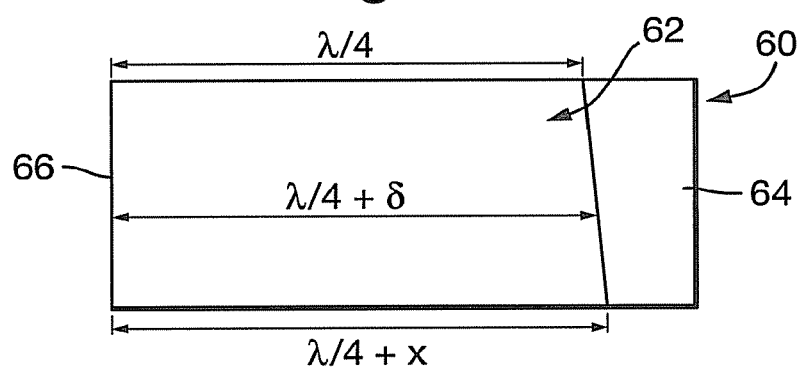
FIG. 14 shows an embodiment of the invention having a variable cavity length.

As mentioned the length of the decoupler cavity, and hence the wavelength at which it will optimally decouple, is determined by the length of area of overlap of the two conducting side walls. Generally the decoupler will be designed with a particular frequency in mind and so the length of the decoupler cavity will be constant across its width. This is conveniently achieved by ensuring the edge of the first conducting side wall which contacts the conducting base portion is substantially parallel to the other edge. However there can be advantages in deliberately changing the length of the cavity across the width. FIG. 14 shows a plan view of the first conducting side wall of a decoupler according to another aspect of the invention.

The decoupler, generally indicated 60, has a first conducting side wall 62. At one end 66 this connects to a conducting base portion to form a closed end. The other end of the decoupler is not parallel to the closed end 66 and instead the length of first conductor layer varies across the layer. This decoupler will therefore form standing waves over a range of different frequencies and could again therefore be used with a range of different tags. The edges of the decoupler layers do not have to be linear and curved edges could be used.

It has been observed that a de-coupler, originally designed for 866 MHz, can also decouple tags that operate at 915 MHz in free-space. By way of an example, the Alien Technologies 915 MHz 'Squiggle' tag is very similar to the Alien 866 MHz tag—the only difference is in the main bulk of the antenna which is tuned for 915 MHz. The antennas for both tags incorporate an impedance loop and the relevant impedance loops are largely identical. It has been shown that the decoupler renders the main bulk of the antenna redundant. Hence when the antenna is on the de-coupler it is only the impedance loop that matters.

The de-coupler is still intercepting power optimally at 866 MHz and intercepting virtually no power at 915 MHz as its performance curve is close to 0 dB at this frequency. Therefore the tag, despite being designed to operate at 915 MHz, is being driven into operation at 866 MHz. This is possible because the chip will operate almost as well at 866 MHz as it will at 915 MHz. Therefore the decoupler intercepts power over a frequency range, but the maximum performance will be achieved when the decoupler, the reader and—to a lesser degree of importance—the tag all operate at the same frequency.

Figure 15:
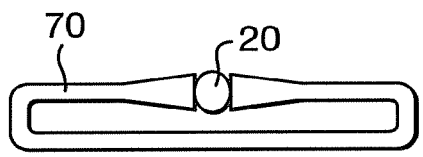
FIG. 15 shows a low Q RF tag.

The present inventors have therefore realised that an RF tag could be used which only has a small antenna. As the decoupler couples radiation into its dielectric core and produces a high electric field at the open end of the cavity, a tag located in this region will be operating in an area of high field and will not require a large tuned antenna. Thus the decoupler of the present invention can be used with a so called low Q tag. FIG. 15 shows an example of a low Q tag, which has a small loop 70 which connects to a chip 20. For example, the loop may be approximately 20 mm in length. Referring back to FIG. 4 it can be seen that the tuned tag has a chip and effective inductance loop but also has a significant additional amount of tuned antenna structure. The low Q tag can therefore be thought of as a smaller variant of a tuned tag. The low Q tag will not function in free space unless the interrogating wavelength corresponds to the antenna's perimeter (e.g. 6 GHz operation for a 5 cm loop), and hence will not operate at standard UHF frequencies (e.g. 866 MHz) unless the reader is located within 1 or 2 mm of the chip, because the antenna 70 is inefficient at coupling to incident UHF radiation. The low Q tag, which may be only slightly larger than the chip itself, may be placed on any decoupler according to the invention. Note that the small loop section may be replaced by short 'arms' that extend outwards or partially wrap around a spacer, since even two short 'stubs' of metal are sufficient to couple power into the chip if combined with a correctly designed decoupler. Reduction in the antenna size allows for a more compact RF ID system without the need to wrap existing antennas around the body of the decoupler. A yet further advantage is reduced materials for the RF ID manufacture process.

It has been found that the geometry of the decoupler, the materials from which it is made and the position and orientation of the tag with respect to the decoupler influence the performance of the system, which in turn determines the range at which the tag can be read. A series of experiments for creating optimised decoupler designs are now described with reference to FIGS. 16 to 29. Maximum read-range is the most common parameter by which the effectiveness of the design changes is measured.

To a first approximation the wavelength in the decoupler core ($\lambda_{Core}$) is related to the wavelength in free-space ($\lambda_{Free-space}$) by the refractive index n, as $$\lambda_{Core} \approx \frac{\lambda_{Free-space}}{n}$$

Figure 16:
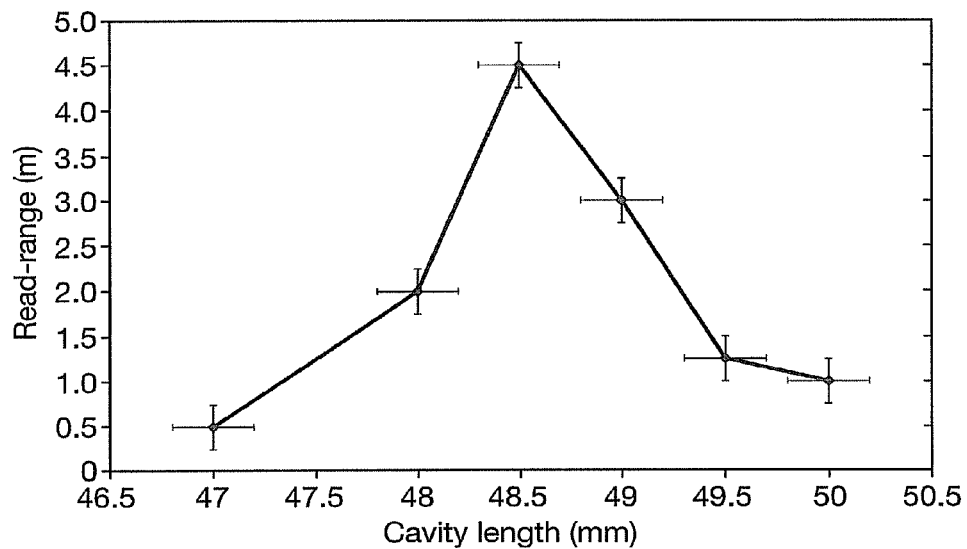

The higher the refractive index of the material the more slowly the waves travel through it. The frequency of the waves remains constant resulting in their wavelength being reduced. Taking PETG (refractive index c.1.8) as an example, the requisite length for a quarter-wavelength decoupler is 48 mm. This can be proved empirically by starting with a quarter-wavelength decoupler that is significantly longer than this and recording the read-range achieved as the decoupler length is reduced. Read-range using an Alien AL870 866 MHz reader system and the loop from an Alien World Tag as a function of cavity length is shown in FIG. 16.

The reduction in length reduces the wavelength of radiation that is trapped within the core and increases the operating frequency of the decoupler. When the length of the decoupler is such that its operating frequency matches that of the reader system the amount of power coupled into the decoupler is maximised and the read-range of the system is maximised.

When the length is reduced still further the operating frequency of the decoupler becomes greater than that of the reader system and the amount of power coupled into the decoupler decreases again resulting in the read-range falling.

It is apparent that the optimum cavity length lies between 48.5 mm and 49 mm which is close to the theoretical value of 48 mm. The minor discrepancy is considered due the perturbation of the decoupler resonance by the tag: there with be an additional reactance due to the interaction of the metal components of the tag and the decoupler which shifts the resonant frequency of the system as a whole.

Figure 17:
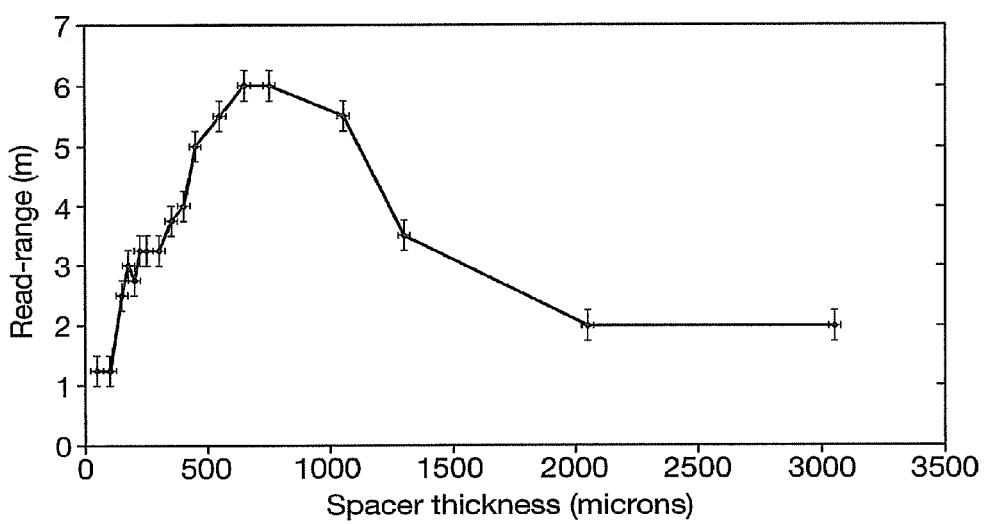

The thickness of a PET spacer between the tag (and loop) and the upper surface of the decoupler was varied from 50 microns to 3000 microns. An 866 MHz reader system was used and the central loop of an 915 MHz Alien Squiggle was used. The read-range as a function of spacer thickness is shown in FIG. 17. The optimum spacer thickness can be seen to lie between 500 microns and 1000 microns.

The trend is as expected: as the spacer thickness is reduced the capacitive coupling between the top metal layer of the decoupler and the part of the loop that overlaps it increases. In the limit where the spacer thickness tends to zero, that side of the loop would be in contact with the upper metal layer. In this case the loop acts as a short between one side of the chip to which it is connected and the top metal layer. This eliminates the voltage across the chip thus no current flows and the system ceases to operate.

As the spacer thickness is increased beyond 1000 microns the strength of the electric field is beginning to fall rapidly: the potential across the antennas terminals is smaller and the read-range is consequently less.

As stated above the decoupler functions by creating regions of greatly enhanced electric field which force a tag placed in any of those regions into operation. There are several locations on the decoupler where the electric field is high and others where is it low-valued. By changing the position of the tag on the decoupler from locations where the electric field is high to locations where it is low it can be demonstrated that it is the electric field rather than the magnetic field that is being exploited.

Consider the quarter-wave decoupler as shown in FIG. 18*a*. The electric field is strongest at the open end of the core or cavity (towards the right as viewed) and goes to zero at the closed end adjacent to the base portion joining the upper and lower conductors. The region of enhanced electric field extends beyond the edge of the cavity but its strength falls off exponentially as distance from the surface of the decoupler increases. The magnetic field is shown, for reference, in FIG. 18*b*, and can be seen to be greatest close to the metal base portion and tends to zero at the open end of the cavity.

The electric field scale runs from 0V/m to 50V/m. The incident wave has an electric field amplitude of 1V/m therefore the electric field has been enhanced by a factor of approximately 50. The magnetic field [free space value $\frac{1}{377}$ A/m] scale runs from 0 A/m to 0.25 A/m therefore the magnetic field has been enhanced by a factor in excess of 70.

Figure 20:
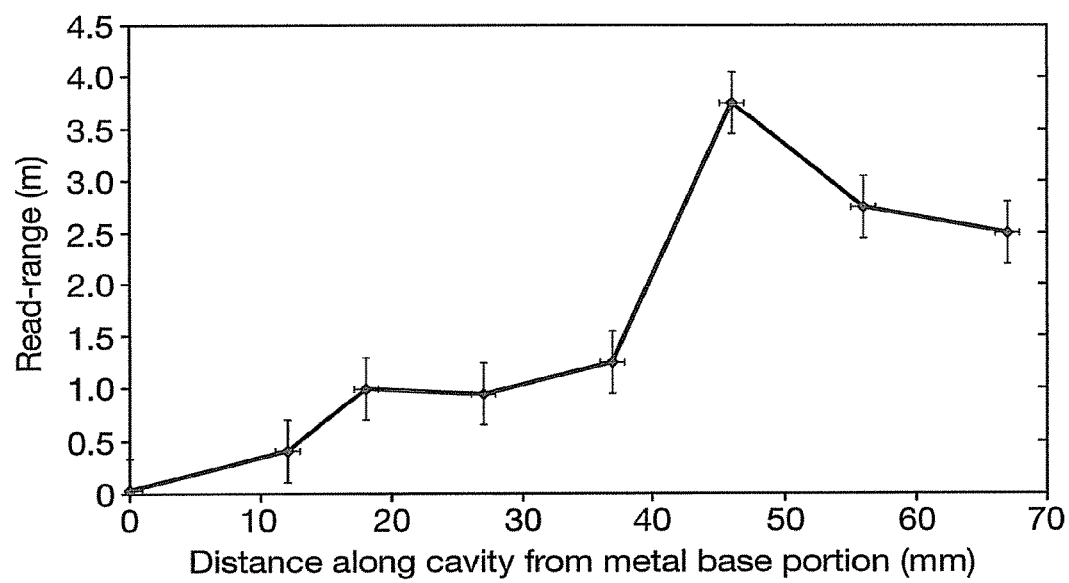

Various placement positions of a tag on a dielectric cavity are shown in FIG. 19, in which the incident electric field is in the direction shown by arrow 1910, substantially perpendicular to the base portion 1900. A tag can be placed anywhere along Side 1, which is opposite the base portion 1900, as shown at 1902, and can be read typically at a range of 4 m for a 50 mm wide PETG core decoupler. It is noted that the tag can also be folded around the open edge of the core as shown at 1904. The tag can also be positioned along Side 2 as shown at 1906 for example. The electric field strength increases moving along side two away from the metal base portion. As expected this causes an increase in the read-range, as illustrated in the graph of FIG. 20.

In this case the decoupler core was 4 mm thick with a cavity length of 67 mm

The maximum read-range occurs some 20 mm in from the edge of the cavity along Side 2.

Moving along the cavity from the base portion towards the open end the electric field and therefore the voltage is increasing and the magnetic field and the current are decreasing—the impedance is therefore increasing. It is suggested, although the applicant is not limited by this suggestion, that the read-range is a maximum at a short distance away from the edge because of slight impedance effects.

Figure 21:
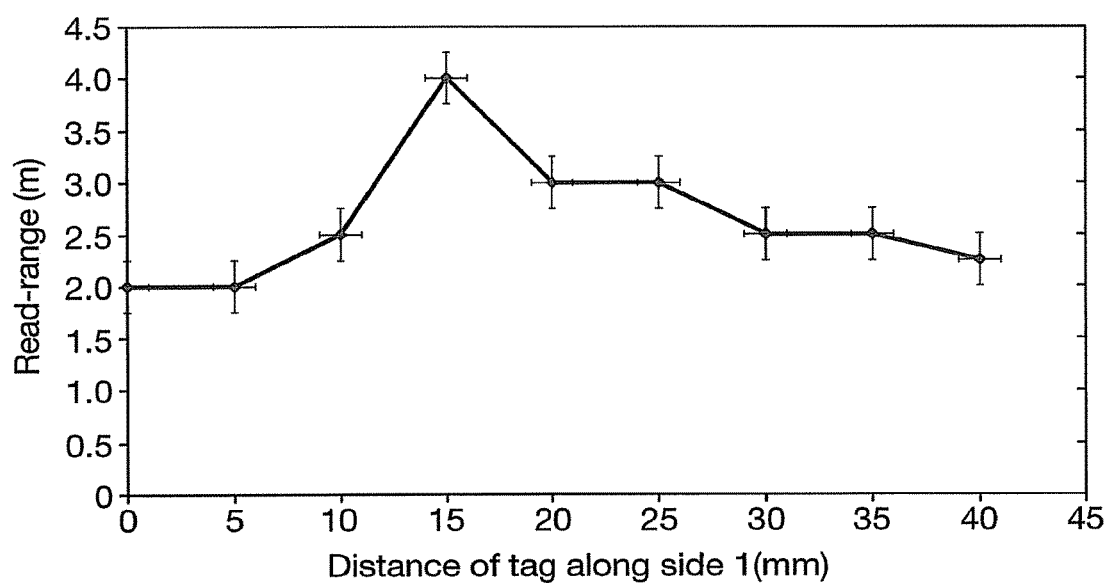

Considering the electric field strength along the open end (Side 1 of FIG. 19) this remains high along the entire length of the open end, hence tags placed anywhere along that end can be read. However, there has been found to be some minor variation in the maximum read-range that can be achieved when the tag is moved along this edge, as illustrated in FIG. 21.

The maximum read-range is achieved near to the centre of the edge and the minimum read-range occurs at the edges. The tag itself is asymmetric and this is believed to be the source of the slight asymmetry in the results.

If the electric field is parallel to a line drawn directly from one antenna terminal to the other, as shown in FIG. 22b, then the voltage between the two terminals will be a maximum, and the read range will be correspondingly high. If the field is perpendicular to the line, as shown in FIG. 22a, then the two terminals will be at the same potential: there will be no current flow between them and the tag cannot be read (this assumes a locally uniform electric field). At angles between perpendicular and parallel the decoupler should function but at a reduced range. An experiment was conducted to determine the relationship between read range and angle. The read-range achieved against the angle of rotation is plotted in FIG. 23.

It can be seen that when the field is parallel to the line between the terminals of the antenna (90°) the read-range is 5 m, when perpendicular to the field (0°) the read-range is zero.

The variation in performance of the device with offset of a chip and loop from the edge of the upper conducting plane will be described with reference to FIGS. 24 to 27.

Figure 24:
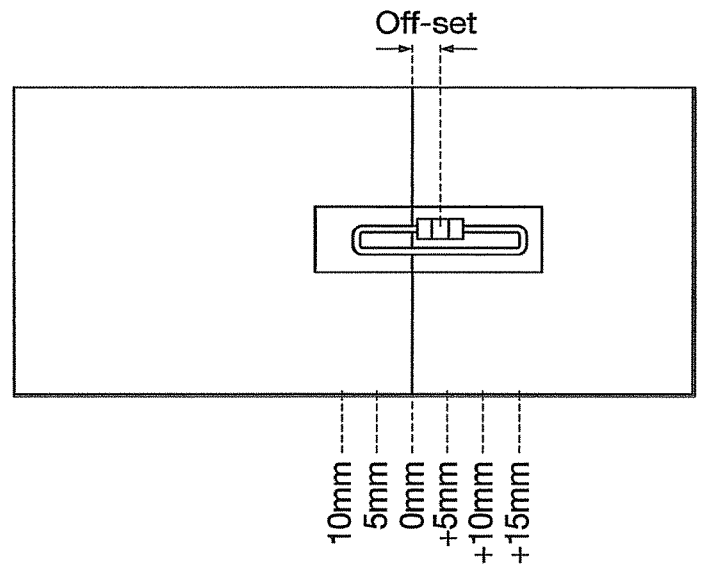
Figure 25:
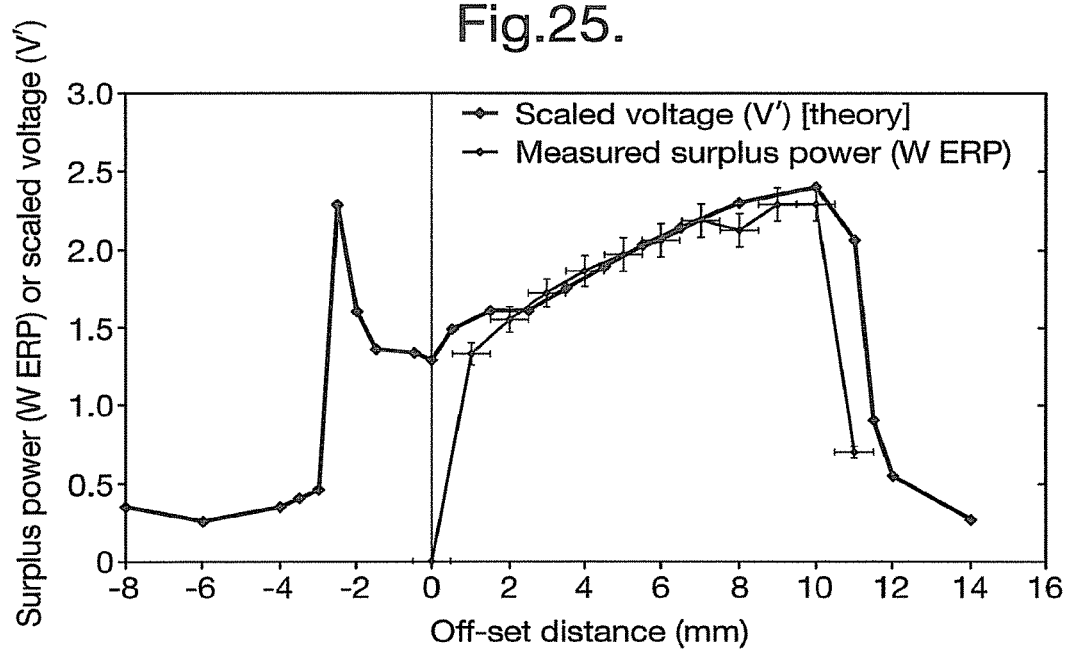

The position of the coupling element, or loop, relative to the edge of the upper conducting layer was varied from −1 mm to +11 mm as shown in FIG. 24. The distance between the reader antennas and the tag was kept constant whilst the power output of the reader system was progressively reduced from the maximum (2 Watts) until a threshold value was reached below which the tag could not be read: the lower this threshold value the better the tag is performing.

Plotting the threshold power versus coupling element position results in a graph that has its lowest value where the tag is performing best. To make the graph more intuitive it has been reversed by subtracting from 2 Watts (the maximum output power of the reader system) the threshold power value. This results in a graph of "surplus power" which has its greatest value where the tag is performing best.

Theoretical modelling allows the voltage across the chip to be calculated as the coupling element is moved relative to the edge of the upper conductor. A series of models were created in which the coupling element was moved from −8 mm to +14 mm and the peak voltage across the chip in each configuration was calculated. In this case the power incident on the tag remained constant therefore a larger voltage indicates a better performing tag. The voltage values were scaled such that the modelled peak voltage value had the same magnitude as the peak surplus power value measured by experiment to make comparison between the two data sets easier. These results are plotted in FIG. 25.

The voltage across the chip increases at it is moved away from 0 mm off-set where the chip is directly above the edge of the upper conducting layer and reaches a maximum at +10 mm beyond which it decreases rapidly. This behaviour can be explained by examining the strength of the electric field around the decoupler.

Figure 26:
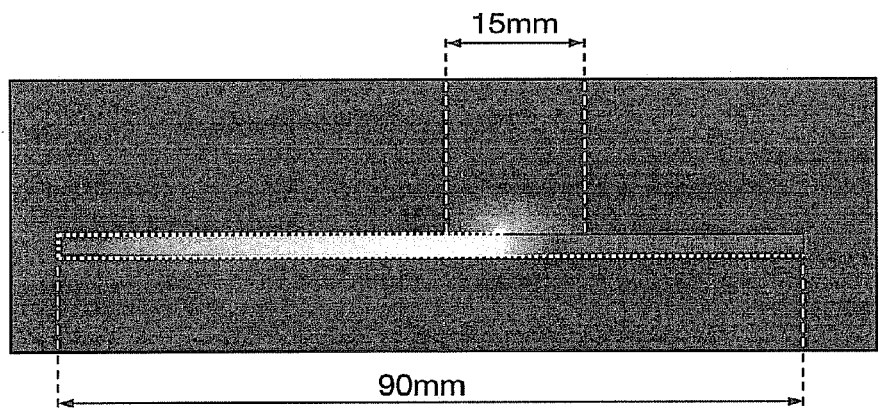
Figure 28:
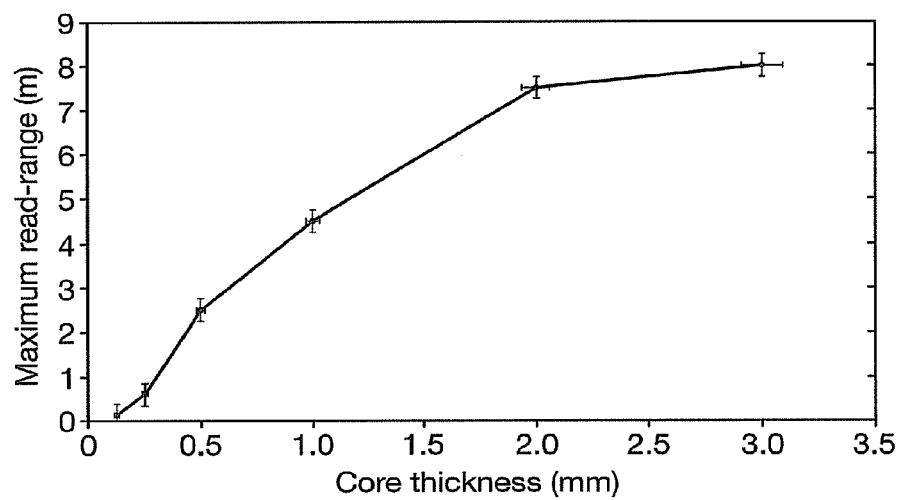
Figure 27:
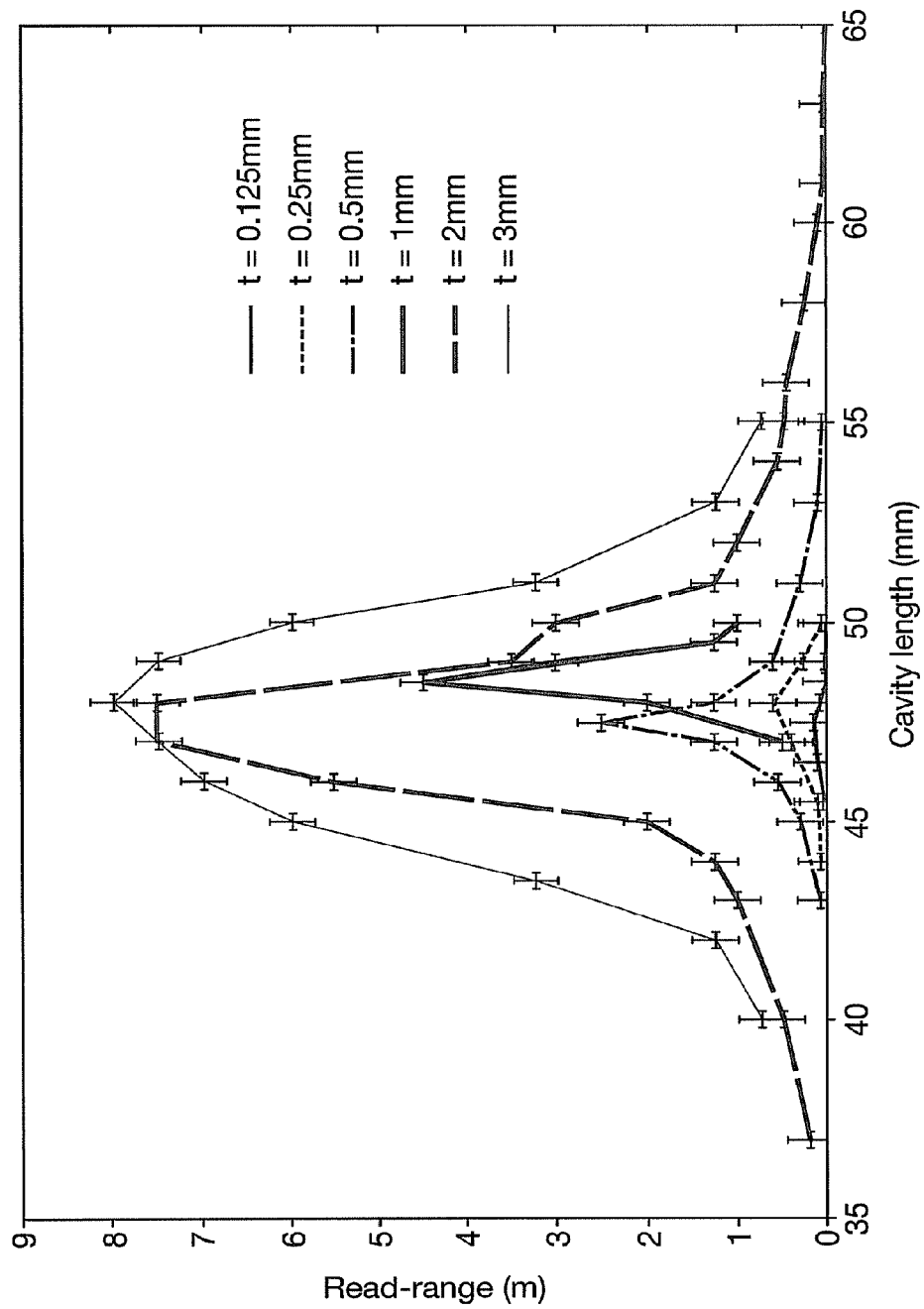

A plot of the magnitude of the electric field on a plane perpendicular to the decoupler is shown in FIG. 26. The plot clearly shows that the region of enhanced electric field extends only a short distance beyond the open end of the decoupler cavity c.15 mm from −5 mm to +10 mm from the edge of the upper conductor.

For clarity the conducting layers have been show as a dotted line. Note that the scale in FIG. 26 runs from 20V/m (black) to 110V/m (white) and that the incident electric field strength (wave amplitude) was 1V/m. This demonstrates that there is electric field enhancement by a factor of 110 at the open edge of the cavity.

The loop used in this example is 22 mm long and therefore extends approximately 10.5 mm to each side of the chip (the chip is c.1 mm square). Beyond +10.5 mm the loop no longer overlaps the edge of the upper metal layer where the field is highest therefore further displacement of the loop away from the edge of the upper conducting plane exposes the loop to a progressively weaker field therefore the voltage across the chip and the surplus power both decrease.

With the chip directly above the edge of the upper conductor (0 mm off-set) the voltage has a local minimum and the tag cannot be read. The failure to read may be due to the voltage being too low to active the chip.

The theoretical model predicts that the voltage should rise again as the coupling element is moved further over the upper conducting layer—has a negative off-set. The voltage falls away rapidly between −2 mm and −4 mm which is due to the asymmetric distribution of the enhanced electric field about the edge of the tuning plane as can be seen from FIG. 3. The experimental measurements were not extended beyond −1 mm so this prediction cannot be verified.

This behaviour demonstrates that the decoupler is acting as a device for creating a highly localised voltage which is then transferred to the chip via capacitive coupling between the decoupler and the loop: the voltage across the chip and the surplus power remain high whilst the portions of the loop adjacent to the chip are within the enhanced field region. Outside of this region the potential gradient (electric field strength) is low hence the voltage across the chip is low. This mechanism of operation is in accordance with the properties discussed with reference to FIG. 22, in which the loop is rotated through 90° in the plane of the decoupler. This places the sections of loop to either side of the chip in regions of equal electrical potential resulting in a zero voltage across the chip. Experiments have confirmed that in this orientation the tag cannot be read.

Considering now the thickness of the dielectric resonant cavity, an experiment was performed in which the thickness (denoted by t) of the decoupler core was varied between 0.125 mm and 3 mm. The optimum cavity length for each core thickness was determined by progressively reducing the cavity length and recording the read-range. In all cases the core material was polyester and the metal layer was formed from aluminium foil. The results are plotted in FIG. 27.

As expected for all the decouplers the read-range hits a peak when the length of the cavity is such that its resonant frequency matches that of the reader system. The peak read-range is much greater for thicker cores than for thinner cores. This variation of maximum read-rage with core thickness is more clearly shown in FIG. 28. However, it will be understood that there is a trade off between thicker cores and the overall thickness of the component. For any given application there will be a suitable core thickness which provides sufficient read range while maintaining a low profile device.

Since the lower layer of the decoupler is metal and the objects onto which the decoupler is placed are often metal, embodiments of the invention use the metal of the object to be tagged as the lower conducting layer. In this case the decoupler becomes a 2-layer device: the upper conducting layer and the dielectric core.

Figure 29:
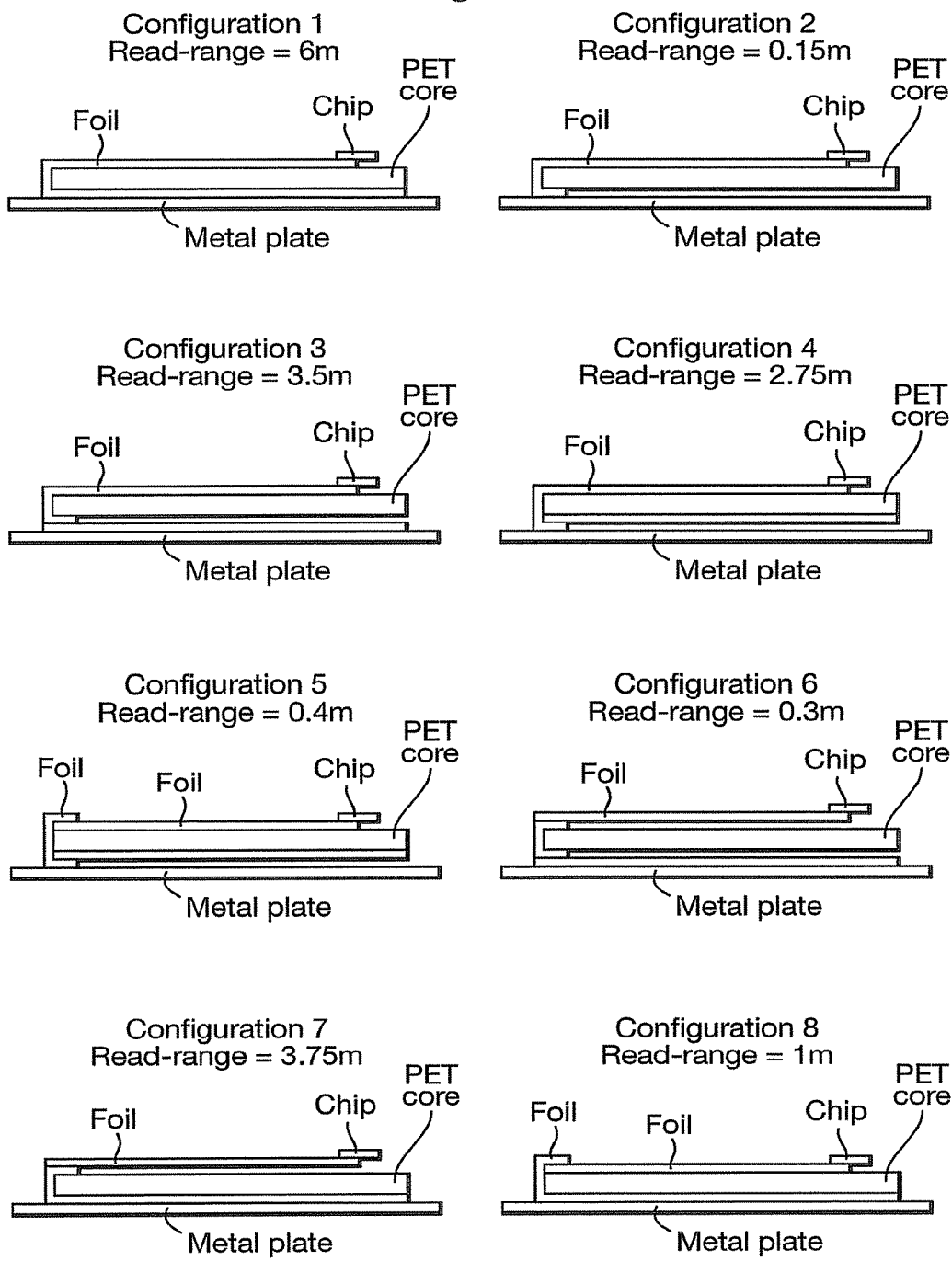
FIG. 29 illustrates possible configurations of the conducting base and wall portions of embodiments of the present invention.

The quarter-wavelength decoupler requires a continuous conducting path around three sides of the dielectric core, hence care must be taken when utilising an object onto which the decoupler is mounted as the lower layer, to avoid substantial discontinuities. A series of tests were performed to asses the various configurations as illustrated in FIG. 29, and the resulting read-ranges.

In all cases the core material was polyester and the tests were carried using the 915 MHz system. The decoupler was 50 mm wide and when optimised found to have a maximum read-range of 6.0 m for a cavity length of 44 mm. The decouplers were fixed to a metal plate larger in extent than the decoupler during the determination of the read-range.

The foil used in making these decouplers is in fact coated with a thin, insulating polymer layer such that when two layers are arranged parallel together there is little or no direct current flow between them. Each configuration introduces different possible sources of discontinuity, as illustrated by the lines of the figures.

It was found that the discontinuities give rise to lower read-ranges with each discontinuity reducing the range by c.40% of the maximum value for a decoupler with a truly continuous conducting layer. Therefore designs with two discontinuities tend to have lower read ranges than designs with one discontinuity which in turn perform less well than decouplers with no discontinuities. The only exception to this rule is Configuration 2 where poor electrical contact between the foil and the metal back plate is the likely cause of the reduced read-range.

Figure 30:
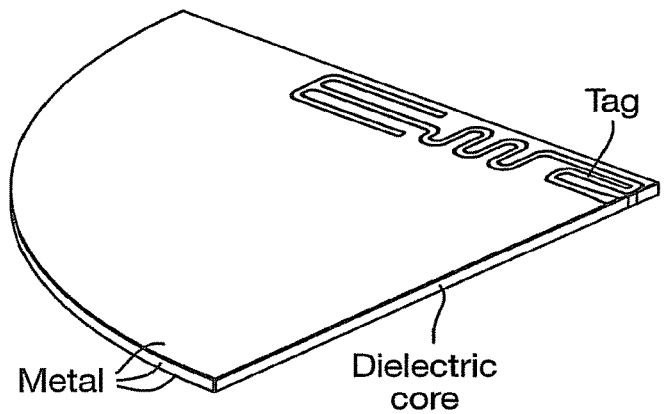
FIG. 30, FIG. 31, FIG. 32A and FIG. 32B show embodiments of the invention having a curved base portion.

FIG. 30 shows an embodiment of a quarter wave decoupler arranged as a quadrant or quarter circle. An advantage of this arrangement is that orientation dependency is reduced.

A given decoupler and tag configuration performs optimally when the resonant dimension of the decoupler is parallel to the incident electric field vector. As the decoupler is rotated read-range falls reaching zero when the resonant dimension is perpendicular to the electric field.

In the example of FIG. 30, the decoupler is made from aluminium foil and 4-5 mm thick corrugated cardboard as the dielectric cavity. The decoupler forms a 90° sector with a continuous piece of foil running over the upper face, around the curved edge and across the lower face. The two straight edges do not have conductors extending over the edges. A tag is arranged at the vertex of the straight edges as shown in FIG. 30.

The radius of the quarter circle was progressively reduced in order to determine the optimum value. Starting from a radius of 158 mm the tag was progressively cut down from the arcuate edge and a maximum read-range of 5.5 m found to occur at a radius of 121 mm.

A further embodiment is similar to that of FIG. 30 but with the corner at which the two straight sides meet truncated to produce a third straight side 27 mm long at 45° to the other two. The maximum read-range was found to be 8 m which occurred for a radius of 120 mm.

Figure 31:
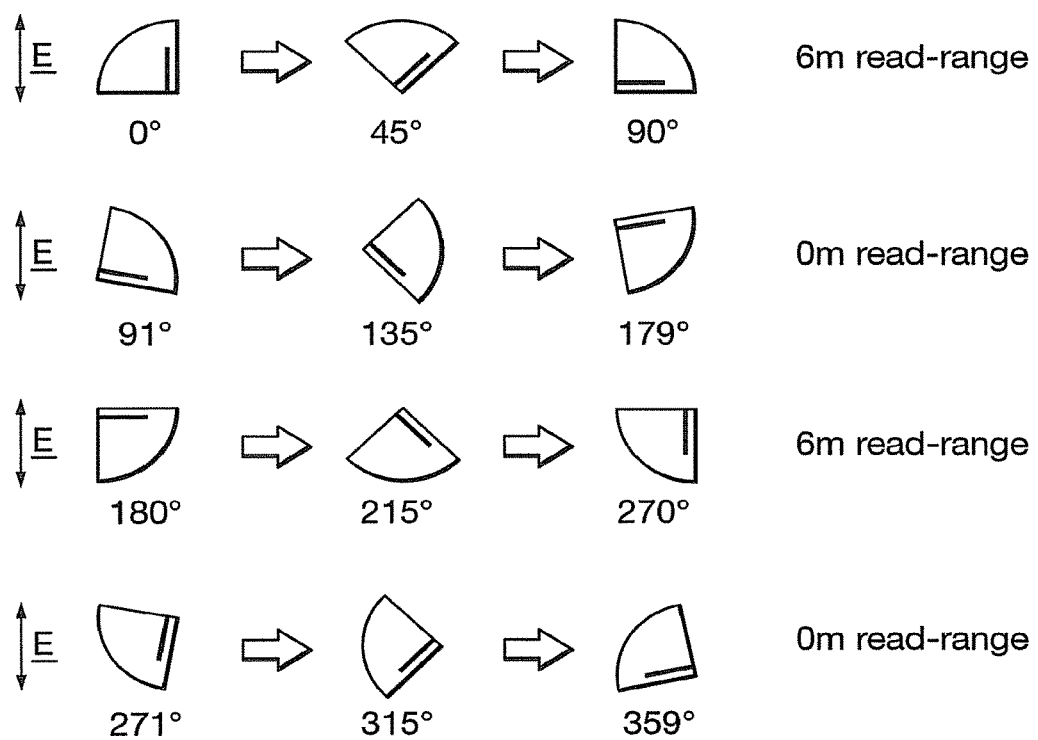

The azimuthal dependence of a quarter circle decoupler was then investigated. The decoupler was rotated through 360° in a plane parallel to that of the reader antenna and containing the incident electric field vector. The results are summarised in FIG. 31 with the electric field indicated by the block arrow, and the solid line on the decoupler representing the long axis of the tag.

The read-range remains constant at 6 m for all angles between 0° and 90° and between 180° and 270°. This is to be expected as within these angular ranges the electric field vector is always parallel to a line drawn radially from the corner closest to the tag such that it lies across a metallic region and therefore is continually sampling the correct resonant dimension. This enables efficient coupling to the resonant mode within the decoupler core. The ranges 90°-180° and 270°-360° returned a read-range of zero as the electric field vector is never parallel to the resonant dimension within this range. Thus the quarter-circle decoupler exhibits orientation independence between 0° and 90° and between 180° and 270°.

Figure 32A:
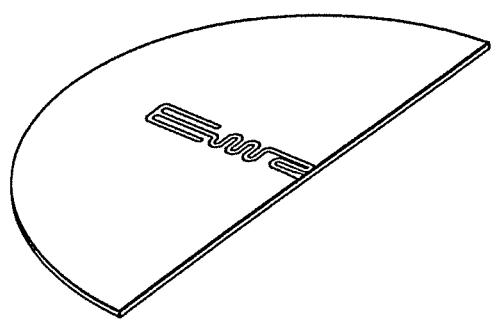
Figure 32B:
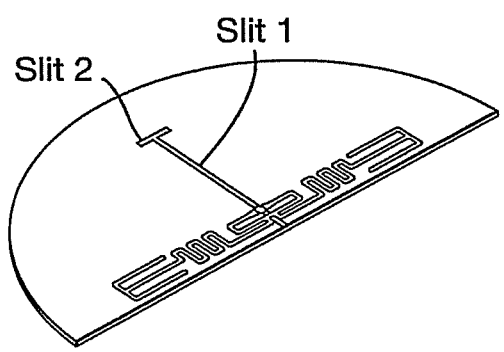

FIG. 32 shows a decoupler which again has an arcuate base portion connecting the upper and lower conducting planes, but this time is semicircular in shape. A slit is cut in the upper part of the conducting layer (as shown by slit 1 in FIG. 32*b*), extending perpendicular from the centre of the straight edge, approximately half of the radius of the decoupler in length.

With the tag wrapped around the straight edge of the decoupler at its centre (as shown in FIG. 32*a*, but with the slit obscured), at a range of 0.5 m the tag could be in read in all orientations (360° rotation in a plane parallel to that of the reader antenna) with the exception of a 10° band about the orientation at which the straight edge of the decoupler was parallel to the electric field of the incident waves. As the distance between the decoupler and the reader antenna was increased the range of angles over which the tag could be read decreased—the orientation dependency increased.

With the tag placed on the top surface of the decoupler, perpendicular to and with its terminals across the slit (as per the tag orientation of FIG. 29*b*) it could be read at several meters when the straight edge of the decoupler was parallel to the electric field but the read range fell to zero if the decoupler was rotated more than 45°.

A second, shorter slit (approximately 10 mm long) was cut at the end of and perpendicular to the first slit thus forming a T-shaped aperture in the upper part of the conducting layer (as shown as slit 2 in FIG. 32*b*). With the tag wrapped around the decoupler (over the longer slit as per FIG. 32*a* tag configuration) it could be rotated 360° and the tag remained readable with only a few 'dead spots' observable.

It will be understood that the present invention has been described above purely by way of example, and modification of detail can be made within the scope of the invention.

Each feature disclosed in the description, and (where appropriate) the claims and drawings may be provided independently or in any appropriate combination.

The invention claimed is:

1. A substantially surface independent EM tag comprising:

an electromagnetic radiation decoupler comprising a cavity structure which comprises a conducting base portion connected to a first conducting side wall formed by a first conducting layer and a second conducting side wall formed by a second conducting layer, the first conducting side wall and the second conducting side wall being substantially parallel to each other, the first and second conducting layers respectively defining upper and lower layers;

a cavity structure area of absence; and an RFID tag mounted in the cavity structure area of absence, an electronic device comprising a chip coupled to an integral antenna wherein the RFID tag is associated with the first conducting side wall or second conducting side wall by capacitive coupling or by Ohmic connection.

2. The EM tag according to claim 1, wherein said RFID tag is associated with the first conducting side wall or the second conducting side wall by differential capacitive coupling.

3. The EM tag according to claim 1, wherein said RFID tag is associated with the first conducting side wall or the second conducting side wall by Ohmic connection.

4. The EM tag of claim 1 wherein a dielectric material is disposed within the cavity structure.

5. The EM tag of claim 1 wherein the first conducting side wall has a continuous length of approximately $\lambda_d/4$ measured from the conducting base portion, where $\lambda_d$ is the wavelength, in the dielectric material, of EM radiation at the frequency of operation v.

6. The EM tag according to claim 1 wherein a dielectric material is disposed within the cavity structure as a continuous layer adjacent the conducting base portion which extends for substantially as long as the first conducting side wall.

7. The EM tag according to claim 1 wherein a dielectric material is disposed within the cavity structure and extends beyond the end of the first conducting side wall.

8. The EM tag according to claim 1 wherein the first and second conducting side walls and conducting base portion comprise a continuous layer of material.

9. The EM tag according to claim 1 the decoupler comprises more than one cavity structure.

10. The EM tag as claimed in claim 1 wherein where in RFID tag is mounted in a vicinity of the edge of the first conducting side wall.

11. The EM tag as claimed in claim 10 wherein the RFID tag is low Q-tag having a small, unturned antenna.

12. The EM tag as claimed in claim 1 wherein the cavity is a resonant dielectric cavity which is suitable for enhancing an incident electric field at an open edge of said cavity.

13. The EM tag as claimed in claim 1 wherein the cavity structure area of absence is at least one slit.

14. The EM tag as claimed in claim 13 including two parallel slits.

15. The EM tag as claimed in claim 1 wherein the decoupler decouples the EM tag from an RF field created by surface to which the EM tag is attached.

16. The EM tag as claimed in claim 1 wherein a length of the first conducting layer is constant across its width.

17. The EM tag as claimed in claim 1 wherein a length of the first conducting layer varies across its width.

18. The EM tag as claimed in claim 1 wherein the first and second conducting side walls and conducting base portion comprise a continuous layer of material.

19. The EM tag as claimed in claim 1 wherein one or more different dielectric materials is disposed between the two conducting side walls to form a dielectric core.

* * * * *